United States Patent
Itoh et al.

(10) Patent No.: US 7,329,479 B2
(45) Date of Patent: Feb. 12, 2008

(54) PROCESS FOR PRODUCTION OF ELECTROLUMINESCENT ELEMENT AND ELECTROLUMINESCENT ELEMENT

(75) Inventors: Norihito Itoh, Tokyo-To (JP); Tomoyuki Tachikawa, Tokyo-To (JP); Kiyoshi Itoh, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 79 days.

(21) Appl. No.: 11/155,006

(22) Filed: Jun. 16, 2005

(65) Prior Publication Data

US 2006/0008742 A1  Jan. 12, 2006

(30) Foreign Application Priority Data

| Jun. 29, 2004 | (JP) | ............................... 2004-192024 |
| Apr. 13, 2005 | (JP) | ............................... 2005-115469 |
| May 27, 2005 | (JP) | ............................... 2005-155298 |

(51) Int. Cl.
*G03F 7/16* (2006.01)
*G03F 7/11* (2006.01)
*G03F 7/30* (2006.01)
*G03F 9/00* (2006.01)

(52) U.S. Cl. ........................ 430/312; 430/314; 430/317

(58) Field of Classification Search ................ 430/312, 430/314, 317
See application file for complete search history.

(56) References Cited

U.S. PATENT DOCUMENTS

| 2002/0072139 A1 | 6/2002 | Kashiwabara |
| 2004/0102577 A1 | 5/2004 | Hsu et al. |

FOREIGN PATENT DOCUMENTS

| EP | 1 566 987 A1 | 8/2005 |
| EP | 1 569 500 A1 | 8/2005 |
| JP | 2003-045656 | * 2/2003 |

* cited by examiner

*Primary Examiner*—Richard L. Schilling
(74) *Attorney, Agent, or Firm*—Burr & Brown

(57) ABSTRACT

A process of producing an electroluminescent element is provided. The production process comprises repeating at least twice a step of forming an electroluminescent layer comprising a buffer layer and a luminescent layer by patterning using a photolithographic process, thereby producing an electroluminescent element comprising a patterned electroluminescent layer. The method includes the steps of forming a first pattern part comprising a first buffer layer as the lowermost layer, and coating a solution for forming a second buffer layer in a region including the first pattern part. The first buffer layer is immiscible with the solution for forming the second buffer layer.

27 Claims, 6 Drawing Sheets

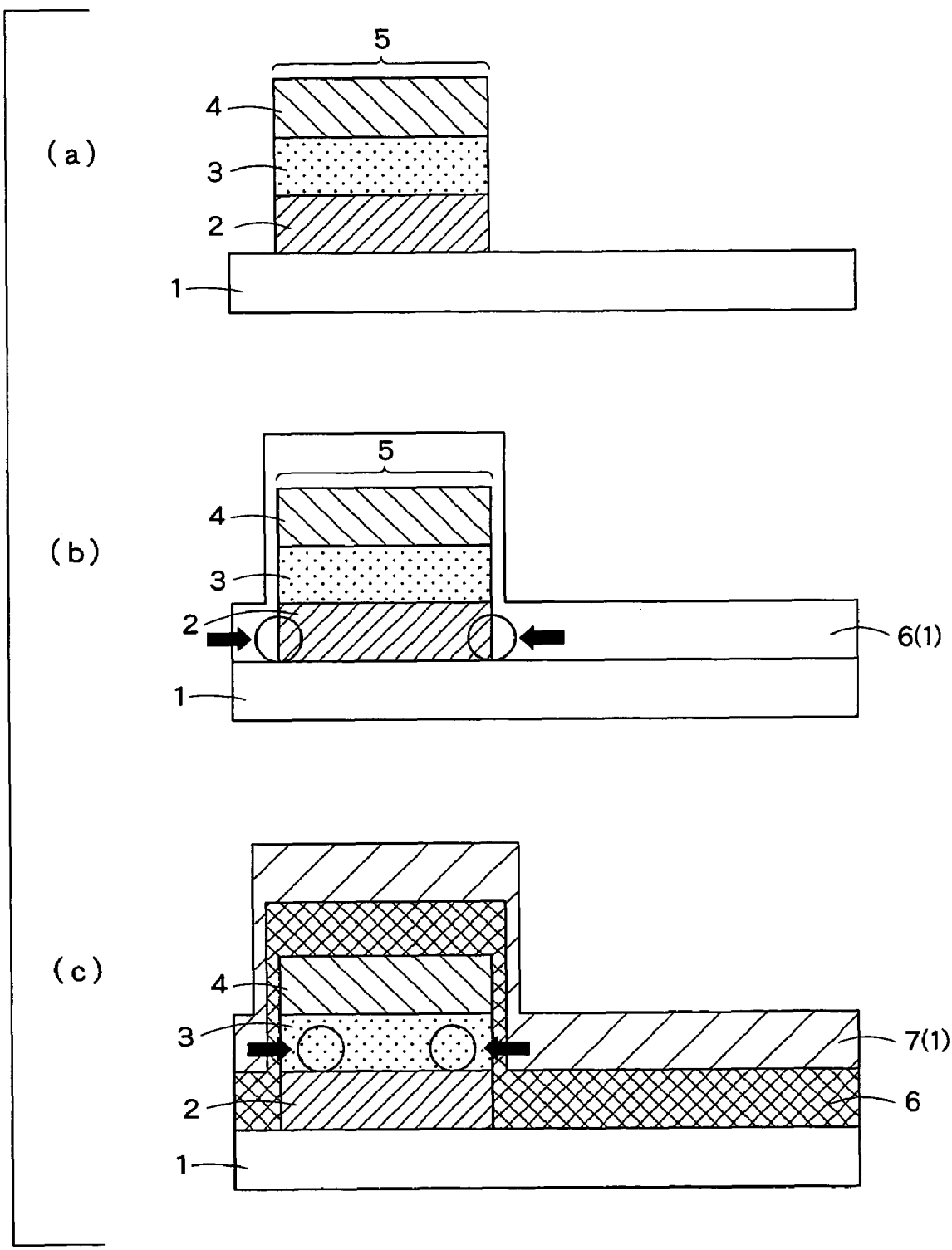
F I G. 1

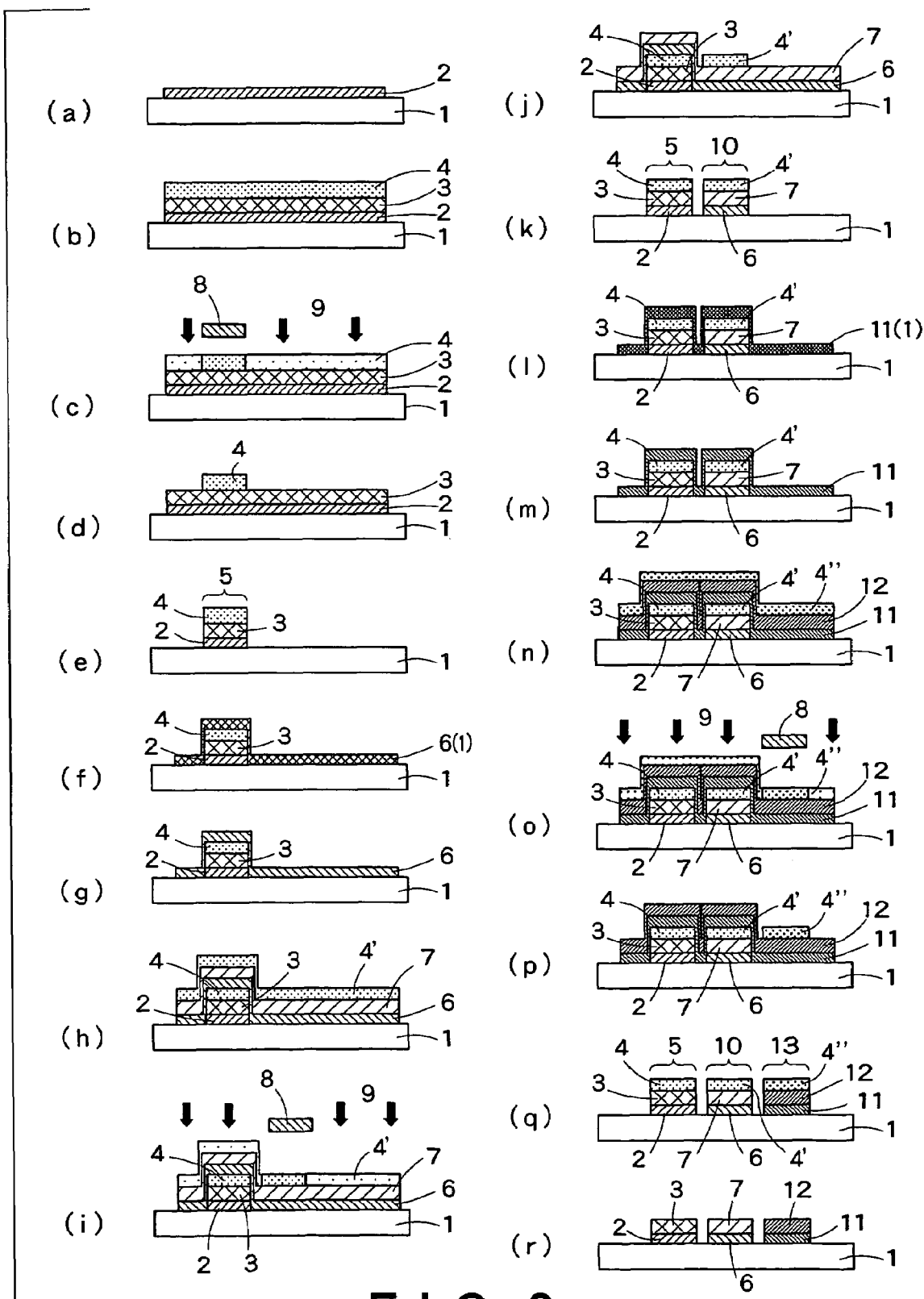
F I G. 2

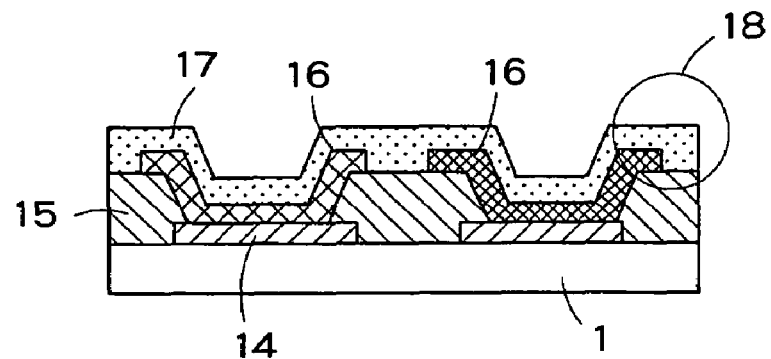
(a)
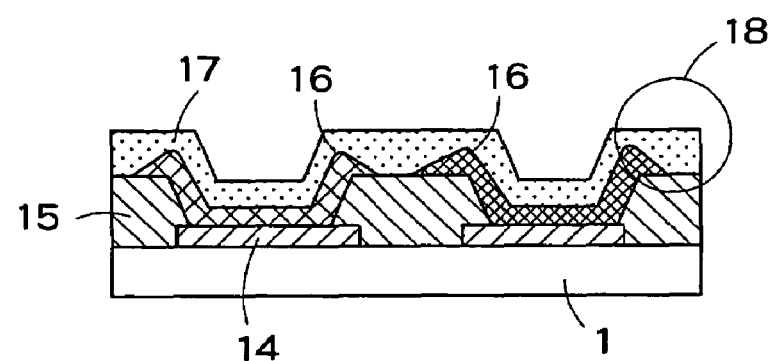
(b)
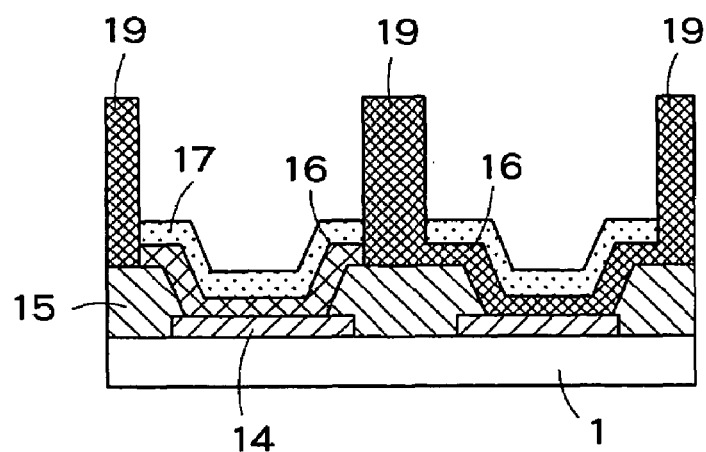
(c)
F I G. 3

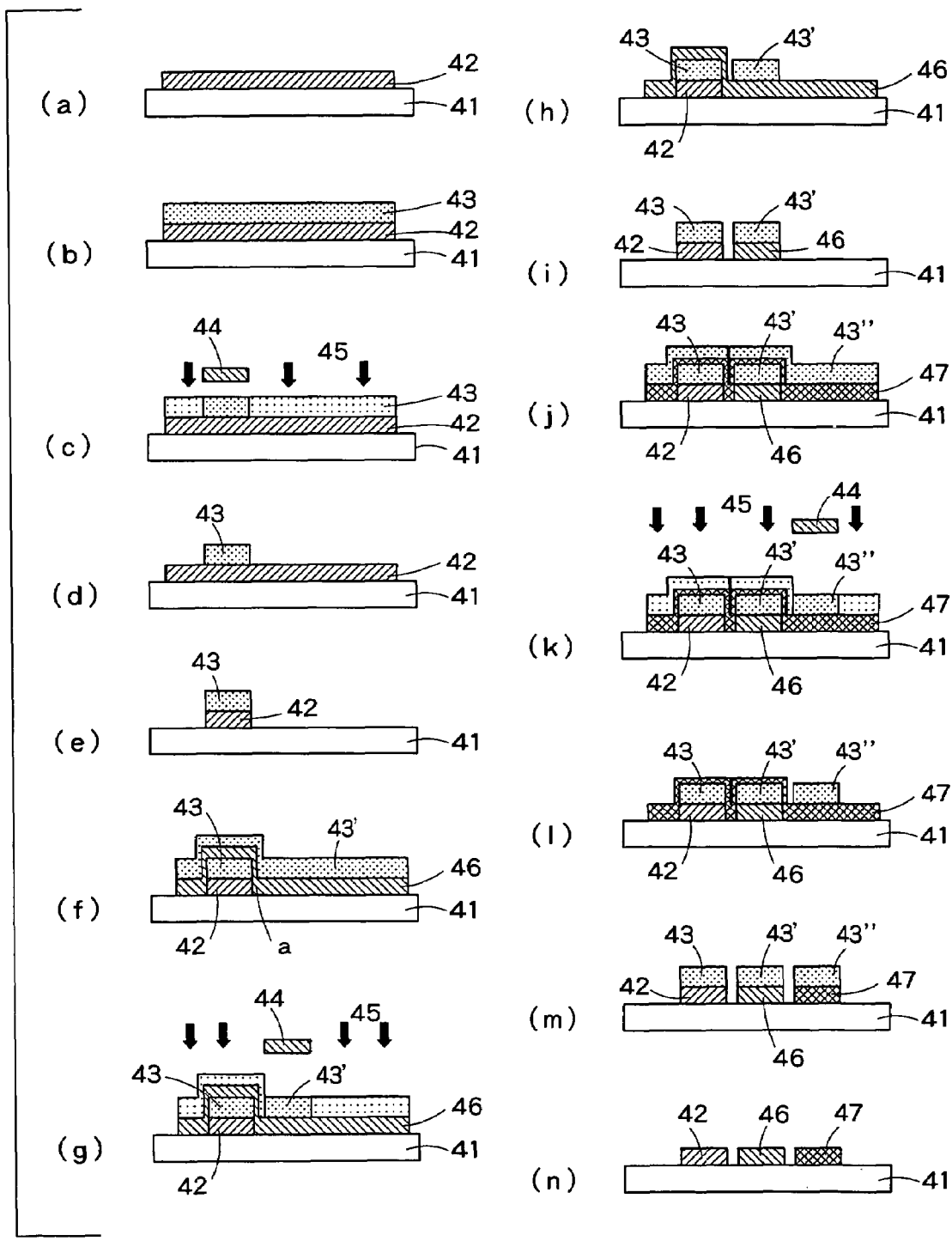
F I G. 4

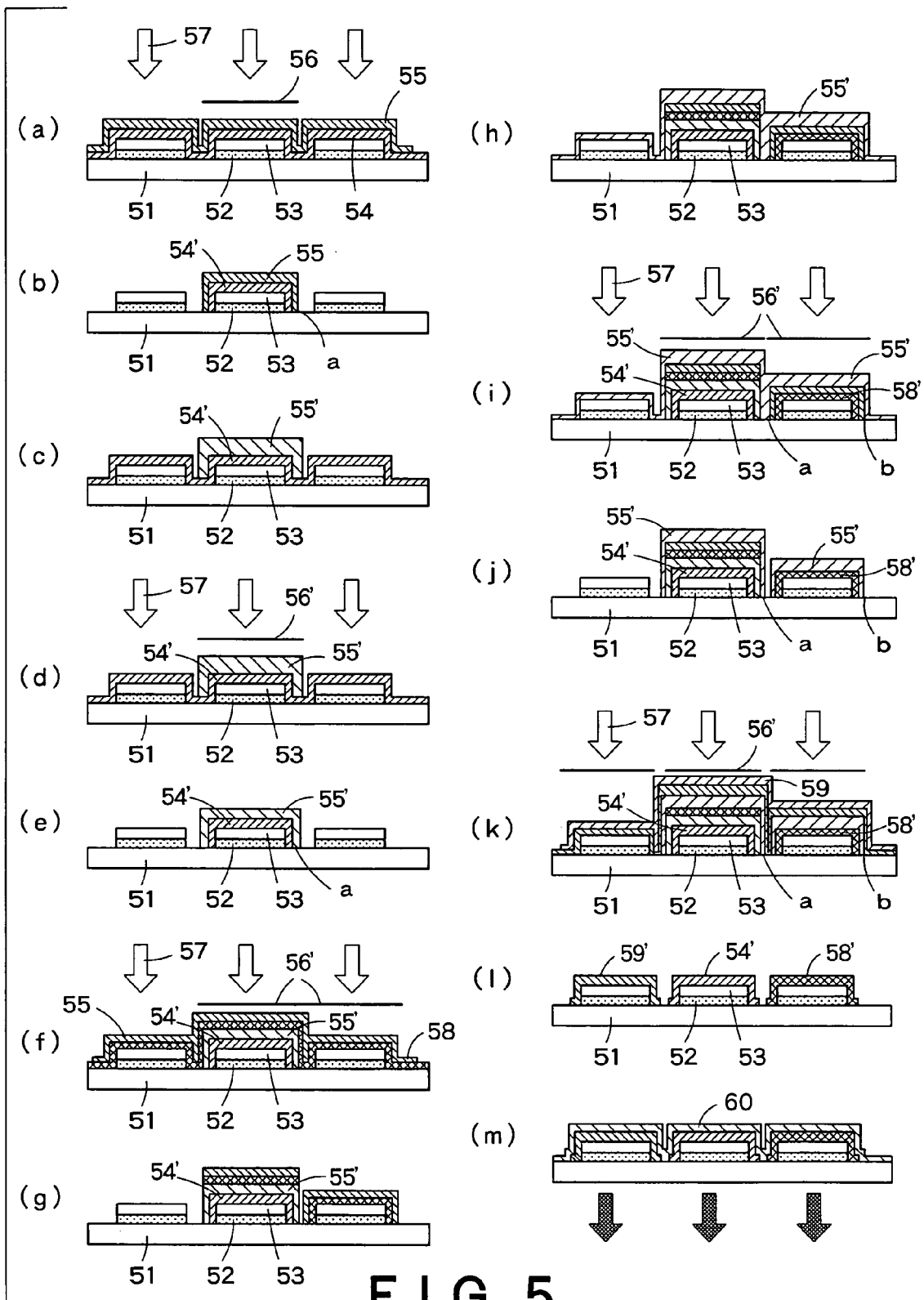
F I G. 5

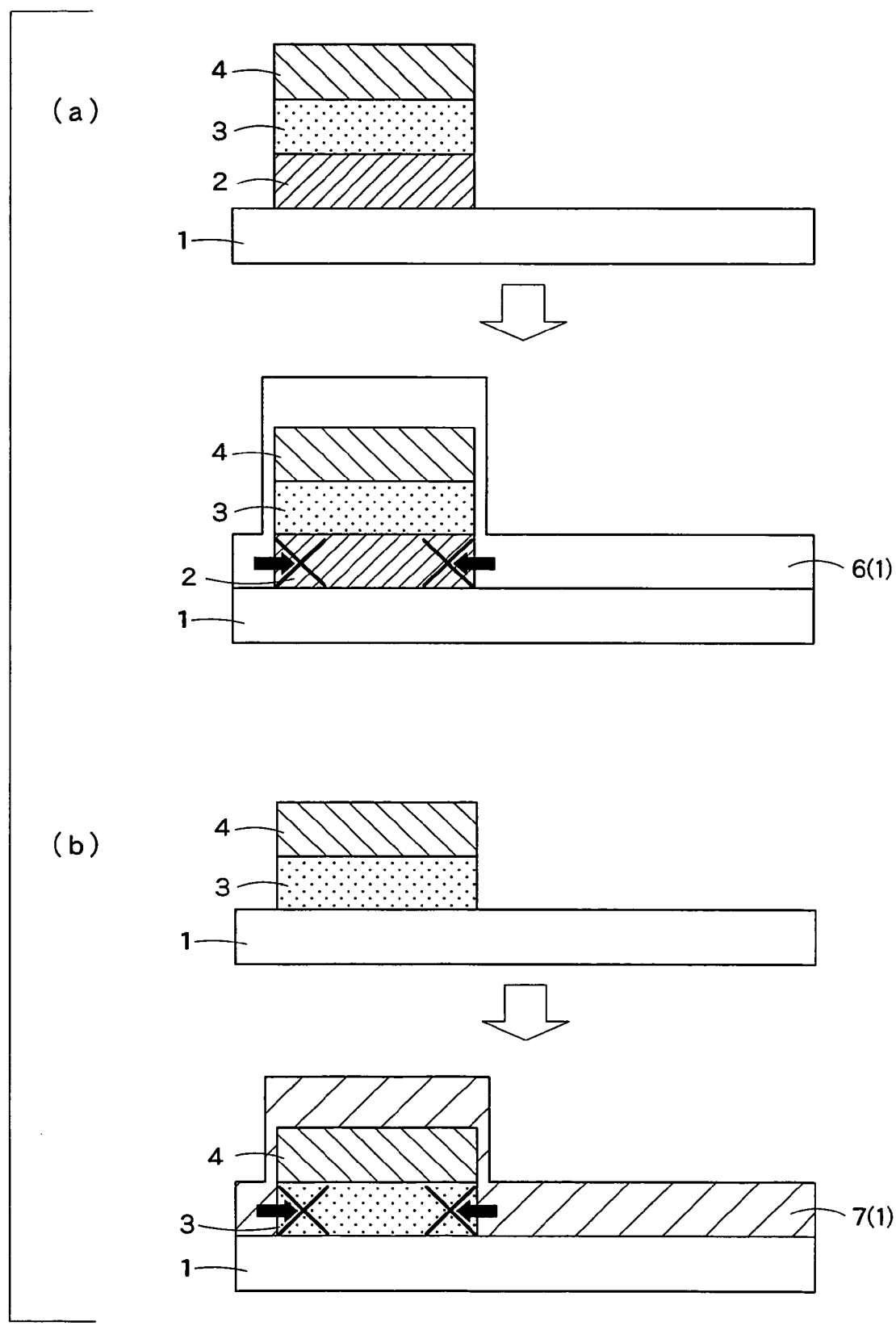
F I G. 6

PROCESS FOR PRODUCTION OF ELECTROLUMINESCENT ELEMENT AND ELECTROLUMINESCENT ELEMENT

BACKGROUND OF THE INVENTION

1. Field of the Invention

The present invention relates to a process for producing an electroluminescent (hereinafter referred to as "EL") element comprising an electroluminescent layer formed by photolithography, and an electro luminescent element.

2. Background Art

EL elements cause holes and electrons, injected from opposed electrodes, to be combined within a luminescent layer to emit energy which excites a fluorescent material within the luminescent layer to emit light of a color corresponding to the fluorescent material, and have drawn attention as selfluminous planar display elements.

Among others, organic thin-film EL displays using an organic material as a luminescent material are expected to be applied to advertising or other low-cost simple displays that have high luminescence efficiency, for example, can realize high-brightness luminescence even in an applied voltage of a little less than 10 V, can emit light in a simple element structure, and can realize luminescence display of a specific pattern.

Such organic EL elements generally have a fundamental structure comprising a first electrode layer and a second electrode layer stacked on top of each other through an organic EL layer, and, in general, the first electrode layer and the organic EL layer are patterned to form an element which can realize different luminescent colors.

Patterning processes for organic EL elements are divided into a dry process in which a luminescent material is vacuum deposited through a shadow mask and a wet process in which a luminescent material dissolved in an organic solvent is coated onto predetermined sites by photolithography or ink jet printing. In these processes, patterning by the wet process can eliminate the need to use an expensive vacuum system and thus is advantageous, for example, in that the production cost can be reduced. In particular, the photolithography can realize higher-definition and higher-accuracy patterning as compared with the other methods and thus is expected to be applied to the preparation of high-accuracy organic EL elements.

In general, however, among solvent-soluble organic EL materials used in the wet process, only a very few organic EL materials can be rendered insoluble in solvents by curing/crosslinking treatment. Therefore, the wet process poses a problem that, in patterning organic EL materials different from each other in color on an identical substrate, the already formed organic EL layer is disadvantageously removed by the solvent.

To overcome this problem, Japanese Patent Laid-Open No. 293589/1997 (patent document 1) discloses that an organic EL element comprising different organic EL materials provided on an identical substrate can be prepared by forming an anode (a first electrode layer), an organic EL layer, a cathode (a second electrode layer), and a protective layer in that order on the whole area of a substrate, then providing a photoresist on the protective layer, patterning the photoresist in a desired shape, and then continuously etching the cathode and the organic EL layer at their sites where the photoresist has been removed, by reactive ion etching (RIE).

Further, Japanese Patent Laid-Open No. 69981/1998 (patent document 2) discloses that organic EL layers different from each other in color can be formed on an identical substrate by using materials prepared by dispersing organic EL materials and the like in an ultraviolet curable resin to render an already formed organic EL layer insoluble in the solvent.

Furthermore, Japanese Patent Laid-Open No. 237075/2001 (patent document 3) describes that redissolution of an already formed organic luminescent layer can be prevented by incorporating an organic luminescent material in a specific heat resistant resin and heat curing the mixture.

In the above methods using a binder resin for fixing the organic EL material and the like, however, since the organic EL material is dispersed in the resin, the luminescence efficiency or the service life is disadvantageously lowered. Further, it should be noted that impurities such as a reaction initiator and ions are present as a mixture in the photosensitive resin used as the binder resin. Therefore, in some cases, the properties of the organic EL material and the like are deteriorated by interaction between these impurities and the organic EL material.

For example, Japanese Patent Laid-Open No. 170673/2002 (patent document 4) proposes a method shown in FIG. 4 as a method for forming a plurality of luminescent parts by photolithography.

At the outset, as shown in FIG. 4(a), a luminescent layer 42 is coated onto a substrate 41 provided with an electrode, and, as shown in FIG. 4(b), a photoresist layer 43 is stacked on the luminescent layer. Subsequently, as shown in FIG. 4(c), only a part where a first luminescent part is to be formed is masked by a photomask 44, and the whole photoresist layer except for the part covered by the photomask is exposed to ultraviolet light 45. The assembly is then developed with a photoresist developing solution, followed by washing to remove the photoresist layer 43 in its exposed area as shown in FIG. 4(d). Further, the assembly at its area where the photoresist layer has been removed to expose the luminescent layer is removed by etching to provide an assembly shown in FIG. 4(e).

The above steps can be repeated three times to pattern three different luminescent parts. Finally, peeling treatment is carried out with a photoresist peeling liquid to expose three different luminescent parts 42, 46, and 47 as shown in FIG. 4(n). Thereafter, for example, the step of forming a second electrode layer on each of the luminescent parts is carried out to prepare an EL element which emits light in a direction below the drawing.

In the above method, however, since the first luminescent part in its end part a and the second luminescent part in its end part b are exposed, in coating other coating liquid for a luminescent layer later, disadvantageously, the patterned luminescent part at its end part is eluted in the coating liquid for a luminescent layer which is coated later, and, consequently, cross contamination and a change in film thickness occurs, resulting in luminescence failure.

For example, Japanese Patent Laid-Open No. 45656/2003 (patent document 5) proposes a method for providing a protective layer as shown in FIG. 5 as a method for preventing such cross contamination and preventing pixels from getting narrower.

In this method, as shown in FIG. 5(a), a coating liquid for a first luminescent layer is first spin coated onto the whole area of an assembly comprising a first electrode layer 52 patterned on a base 51 and a buffer layer 53 provided on the first electrode layer 52. The whole area coated coating liquid for a first luminescent layer is dried and cured to form a first luminescent layer 54. A positive-working photoresist is coated on the whole area of the first luminescent layer 54 to form a primary photoresist layer 55 (the step of forming a luminescent layer and a primary photoresist layer). Subsequently, ultraviolet light 57 is applied patternwise using a primary photomask 56 so that a part corresponding to the first luminescent part is not exposed (FIG. 5(*a*)).

The primary photoresist layer 55 in its exposed part is developed with a photoresist developing liquid followed by washing with water to remove the primary photoresist layer 55 in its exposed part (the step of developing primary photoresist layer). Upon further development with a luminescent layer developing liquid, the luminescent layer 54 only in its part not covered with the primary photoresist layer 55 is removed (FIG. 5(*b*), step of developing luminescent layer).

Further, as shown in FIG. 5(*c*), a positive-working photoresist is further coated onto the whole area thereof to form a secondary photoresist layer 55' (the step of forming a secondary photoresist layer).

A secondary photomask 56' having a larger width than the primary photomask 56 for masking the primary photoresist layer shown in FIG. 5(*a*) is used for exposure to ultraviolet light 57 (FIG. 5(*d*)). The secondary photoresist layer 55 in its exposed part is then developed with a photoresist developing liquid and is washed with water to form a secondary photoresist layer 55' (protective layer) covering the first luminescent part 54' and its end part a as shown in FIG. 5(*e*) (the step of developing secondary photoresist layer).

Thus, in patterning one luminescent layer, carrying out the step of developing photoresist twice, that is, the step of developing a primary photoresist layer and the step of developing a secondary photoresist layer, is advantageous in that, in such a state that the first luminescent part 54' in its end part a is covered by the photoresist layer, the coating liquid for a second luminescent layer can be coated for next luminescent part formation, that is, second luminescent part formation. Therefore, even when the coating liquid for a second luminescent layer is coated in FIG. 5(*f*), any problem such as cross contamination does not occur.

The above steps are repeated three times, and the photoresist is then peeled off to form a first luminescent part 54', a second luminescent part 58', and a third luminescent part 59' (FIG. 5(*l*)). Finally, as shown in FIG. 5(*m*), a second electrode layer 60 is formed on the luminescent parts to produce an EL element which emits electroluminescent light in a direction below the drawing.

In the above method for forming a secondary photoresist layer (a protective layer) covering the end part a, the cross contamination and narrowing of pixels can be prevented, but on the other hand, the number of steps is large, posing a problem of production efficiency.

SUMMARY OF THE INVENTION

In view of the above problems of the prior art, the present invention has been made, and an object of the present invention is to provide a production process of an electroluminescent element, which, while utilizing the advantages of photolithography, can prevent such an unfavorable phenomenon that the end part of the patterned part is eluted in a coating liquid coated after the formation of that part and, consequently, luminescent failure occurs as a result of cross contamination and a change in layer thickness and can realize high production efficiency, and to provide an electroluminescent element using the same.

According to one aspect of the present invention, there is provided a process for producing an electroluminescent element, comprising repeating at least twice the step of forming an electroluminescent layer comprising a buffer layer and a luminescent layer by patterning using a photolithographic process, thereby producing an electroluminescent element comprising a patterned electroluminescent layer, the process comprising the steps of:

forming a first pattern part comprising a first buffer layer as the lowermost layer; and coating a solution for second buffer layer formation in a region including the first pattern part, the first buffer layer being immiscible with the solution for second buffer layer formation.

In the present invention, the formed first buffer layer is not miscible with the solution for second buffer layer formation. Therefore, after patterning an electroluminescent layer including the first buffer layer by photolithography, when the solution for second buffer layer formation is coated onto a region including the first pattern part, the end part of the already patterned first buffer layer is not eluted in the solution for second buffer layer formation coated after the formation of that part. Therefore, luminescence failure derived from cross contamination or a change in layer thickness does not occur.

Further, even in the case where a luminescent layer is further provided on the buffer layer, the material for luminescent layer formation selected is generally a material of which the solubility is different from the material for buffer layer formation so that the material can be coated onto the buffer layer. Therefore, the end part of the already patterned first luminescent layer is not eluted in the solution for second buffer layer formation coated later, and, in addition, the coated second buffer layer functions as a protective layer, and, thus, elution of the end part of the first luminescent part in the solution for second luminescent layer formation coated later can be prevented.

In the prior art technique, when the step of forming an electroluminescent layer by patterning using photolithography is repeated twice or more, in the step of forming the first pattern part and the step of forming the second pattern part, in general, the material for luminescent layer formation in the first pattern part is identical to or has the same solubility as the material for luminescent layer formation in the second pattern part, and the material for buffer layer formation in the first pattern part is identical to or has the same solubility as the material for buffer layer formation in the second pattern part. Therefore, the solvent for the solution for first luminescent layer formation is identical to or has the same solubility as the solvent for the solution for second luminescent layer formation, and the solvent for the solution for first buffer layer formation is identical to or has the same solubility as the solvent for the solution for second buffer layer formation. Therefore, when the end face of the already patterned part is exposed, the step of forming the second pattern part poses a problem that, in coating the solution for second lowermost layer formation using a solvent which is identical to or has the same solubility as the solvent for the first coated solution, the end part of the lowermost layer in the pattern part is disadvantageously eluted in the solution. For example, in FIG. 6(*a*), when, in the step of forming a second pattern part, onto a base comprising a buffer layer 2, a luminescent layer 3, and a photoresist layer 4 formed in that order on a substrate 1 provided with an electrode in the step of forming a first pattern part is coated a solution 6(1) for buffer layer formation which is the same as in the first buffer part, the end part of the first buffer part having the same solubility is disadvantageously dissolved in the solution 6(1) for buffer layer formation. Further, in FIG. 6(*b*), when, in the step of forming a second pattern part, onto a base comprising a luminescent layer 3 and a photoresist layer 4 formed in that order on a substrate 1 provided with an electrode in the step of forming a first pattern part is coated a solution 7(1) for second luminescent layer formation using a solvent having dissolving power similar to that of the solvent used in the first luminescent part formation, the end part of the first luminescent part having the same solubility is disadvantageously dissolved in the solution 7(1) for second luminescent layer formation. The dissolution of the end part poses a problem that luminescent failure occurs due to cross contamination and a change in layer thickness.

The production process of an electroluminescent element according to the present invention, as shown in FIG. 1, includes the step of forming a first pattern part 5 including a first buffer part 2 as the lowermost layer (FIG. 1(a)) and the step of coating a solution 6(1) for second buffer layer formation as the lowermost layer in a region including the first pattern part. In this process, a combination of the first buffer part with the solution for second buffer layer formation is such that the first buffer part is not miscible with the solution for second buffer layer formation. Therefore, in the first stage in the step of forming a second pattern part, when a solution 6(1) for second buffer layer formation is coated in a region including the first pattern part 5 so as to form the lowermost layer, the end part of the already patterned first buffer part 2 is not eluted in the solution 6(1) for second buffer layer formation coated later (FIG. 1(b)). Further, even when a luminescent layer 3 is further provided, on the buffer layer 2, as an electroluminescent layer formed by photolithography, since the material for luminescent layer formation selected is generally a material having a solubility different from the material for buffer layer formation so that the material can be stacked onto the buffer layer by coating, the end part of the already patterned first luminescent part 3 is not eluted in the later coated solution 6(1) for second buffer layer formation and, in addition, the coated and dried second buffer layer 6 functions as a protective layer, it is possible to prevent the end part of the first luminescent part from being eluted in the solution 7(1) for second luminescent layer formation coated later (FIG. 1(c)).

Likewise, even when a photoresist part 4 is further provided on the first buffer part, since the material for the photoresist layer is generally selected by taking into consideration the solubility so that the photoresist layer can be stacked by coating on the buffer layer, the end part of the already patterned first photoresist layer 4 is not eluted in the solution 6(1) for second buffer layer formation coated later and, in addition, the coated second buffer layer 6 functions as a protective layer, it is possible to prevent the end part of the first photoresist layer 4 from being eluted in the solution for second photoresist layer formation coated later.

Accordingly, in the present invention, without the formation of a second photoresist layer (a protective layer) for covering the end part a of the patterned part as described in Japanese Patent Laid-Open No. 45656/2003, the occurrence of luminescence failure attributable to cross contamination or a change in layer thickness as a result of elution of the end of the patterned part in the coating solution coated after the formation of that part can be prevented. That is, in the present invention, an element, which comprises a plurality of types of high-definition pattern and exhibits good luminescence characteristics, can be prepared in a relatively easy and inexpensive manner.

BRIEF DESCRIPTION OF THE DRAWINGS

FIG. 1 is a cross-sectional view showing one example of the production process of an EL element according to the present invention;

FIG. 2 is a cross-sectional view showing one example of patterning using photolithography according to the present invention;

FIG. 3(a) is a diagram showing one example of an EL element using photolithography and FIG. 3(b) and FIG. 3(c) are cross-sectional views showing one example of the conventional EL element;

FIG. 4 is a cross-sectional view showing one example of patterning using photolithography;

FIG. 5 is a cross-sectional view showing another example of patterning using photolithography; and FIG. 6 is a cross-sectional view showing one example of the conventional production process of an EL element.

DETAILED DESCRIPTION OF THE INVENTION

Definition

The production process of an electroluminescent element according to the present invention comprises repeating at least twice the step of forming an electroluminescent layer comprising a buffer layer and a luminescent layer by patterning using a photolithographic process, thereby producing an electroluminescent element comprising a patterned electroluminescent layer, the process comprising the steps of: forming a first pattern part comprising a first buffer layer as the lowermost layer; and coating a solution for second buffer layer formation in a region including the first pattern part, the first buffer layer being immiscible with the solution for second buffer layer formation.

The term "buffer layer" as used herein refers to a buffer layer formed at a predetermined position, and the term "pattern part" as used herein refers to a pattern part formed at a predetermined position. The first pattern part may have a single layer structure of the first buffer layer or alternatively may have a multilayer structure comprising the first buffer layer as the lowermost layer. The term "buffer layer" as used herein refers to a layer provided between an anode and a luminescent layer or between a cathode and a luminescent layer and functions to facilitate injection of charges into the luminescent layer and/or functions to flatten unevenness of electrodes or the like.

The term "luminescent layer" as used herein refers to a layer formed by coating a solution for luminescent layer formation and drying the coating, and the term "luminescent part" refers to a luminescent layer formed at a predetermined position.

Further, in "first, second" as used herein, in a process in which patterning is carried out twice or more by photolithography, the step in the arbitrary number refers to a first step, and the step which is carried out later than the first step is referred to as a second step. In this case, "later" is not limited to a time point immediately after the first step.

The expression "the first buffer layer is immiscible with the solution for second buffer layer formation" means that the formed first buffer layer is not eluted in the solution for second buffer layer formation, that is, that the solubility of the first buffer layer in the solvent contained in the solution for second buffer layer formation is not more than 0.001 (g/g-solvent) under conditions of 25° C. and 1 atm.

Production Process of Electroluminescent (EL) Element

In the present invention, the EL layer constituting the EL element comprises at least a buffer layer and a luminescent layer and may be in combination with other layers, for example, a hole transport layer, a hole injection layer, an electron transport layer, and an electron injection layer.

When both the buffer layer and the luminescent layer are formed by patterning using photolithography, the material for buffer layer formation selected is preferably insoluble in a photoresist solvent and a solvent for luminescent layer formation which will be described later. More preferably, the material for buffer layer formation selected is insoluble in a photoresist peeling liquid.

On the other hand, when the luminescent layer is formed by vacuum deposition or the like and the layer patterned by photolithography as the EL layer is only a buffer layer, preferably, the material for buffer layer formation selected is insoluble in a photoresist solvent and a photoresist peeling liquid which will be described later.

The present invention comprises the step of forming a first pattern part including a first buffer layer as the lowermost layer and the step of coating a solution for second buffer layer formation as the lowermost layer in a region including the first pattern part. In this case, a combination of the first buffer part with the solution for second buffer layer formation is that the first buffer layer is immiscible with the solution for second buffer layer formation, and the buffer layer is formed as the lowermost layer in the electroluminescent layer formed by photolithography.

(1) Production Process in First Embodiment of Invention

In the first embodiment of the present invention, the first buffer layer can be rendered immiscible with the solution for second buffer layer formation by subjecting the buffer layer to curing treatment. The curing treatment means that curing is carried out to such a level that the cured layer is substantially undissolvable or immiscible. This can be judged using, as an index, such a state that, when the buffer layer after curing is brought into contact with a solvent constituting the solution for buffer layer formation for one min, the solubility is not more than 0.001 (g/g-solvent) under conditions of 25° C. and 1 atm.

Preferably, the material for buffer layer formation comprises at least a material that is curable upon exposure to heat or radiation energy. Specific examples of curable materials include sol gel reaction solutions, photocurable resins, and heat curable resins. The sol gel reaction solution refers to a reaction solution that gels upon curing. They are suitable as a binder in the material for buffer layer formation.

In the present invention, the first buffer layer is preferably formed using a coating liquid for buffer layer formation, comprising at least a metal oxide and a heat- and/or photocurable binder. The reason for this is that this buffer layer is good in charge injection efficiency and, in addition, the buffer layer can be brought to a cured state and thus has good function as the buffer layer in the first embodiment. Such metal oxides include alkali metal oxides, alkaline earth metal oxides, transition metal oxides, and typical metal oxides.

In other embodiment of the present invention, the first buffer layer is preferably formed using a coating liquid for buffer layer formation, comprising at least a photocatalyst and a heat-and/or photocurable binder. The photocatalyst-containing layer formed in this case functions as a buffer layer, and, in addition, the surface of the photocatalyst-containing layer can be rendered hydrophilic by application of a radiation on the whole area after the formation thereof. Accordingly, when an EL layer is further formed by a wet process on the buffer layer, the solution for EL layer formation can easily be coated and, even when the solution should be thinly coated, even coating can be realized.

For example, titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$) known as semiconductors may be mentioned as the photocatalyst. They may be used either solely or as a mixture of two or more.

Among them, titanium dioxide is particularly suitable because of its high bandgap energy, chemically stable and nontoxic nature, and easy availability. In the present invention, both anatase form of titanium oxide and rutile form of titanium oxide may be used. However, the use of anatase form of titanium oxide is preferred.

Further, preferably, the binder used in the present invention comprises organopolysiloxanes. Among organopolysiloxanes, those which have a main skeleton having such high binding energy as not to be decomposed by photoexcitation of the photocatalyst and contains an organic substituent decomposable upon exposure to the action of a photocatalyst are preferred, and examples thereof include (1) organopolysiloxanes which, through a sol gel reaction or the like, hydrolyze or polycondense a chloro- or alkoxysilane or the like to exhibit great strength, and (2) organopolysiloxanes which are prepared by crosslinking reactive silicone and has excellent water repellency and oil repellency. In the case of organopolysiloxanes (1), they are preferably a hydrolyzed condensate or cohydrolyzed condensate of one or two or more silicon compounds represented by formula $Y_nSiX_{(4-n)}$ wherein Y represents an alkyl, fluoroalkyl, vinyl, amino, phenyl, or epoxy group; X represents an alkoxyl group, an acetyl group, or a halogen; and n is an integer of 0 to 3. Here the number of carbon atoms of the group represented by Y is preferably in the range of 1 to 20, and the alkoxy group represented by X is preferably a methoxy, ethoxy, propoxy, or butoxy group.

A fluoroalkyl-containing polysiloxane may also be used as the binder, and specific examples thereof include hydrolyzed condensate or cohydrolyzed condensate of one or two or more of various fluoroalkylsilanes.

More specific examples thereof include methyltrichlorosilane, methyltribromosilane, methyltrimethoxysilane, methyltriethoxysilane, methyltriisopropoxysilane, methyltri-t-butoxysilane; ethyltrichlorosilane, ethyltribromosilane, ethyltrimethoxysilane, ethyltriethoxysilane, ethyltriisopropoxysilane, ethyltri-t-butoxysilane; n-propyltrichlorosilane, n-propyltribromosilane, n-propyltrimethoxysilane, n-propyltriethoxysilane, n-propyltriisopropoxysilane, n-propyltri-t-butoxysilane; n-hexyltrichlorosilane, n-hexyltribromosilane, n-hexyltrimethoxysilane, n-hexyltriethoxysilane, n-hexyltriisopropoxysilane, n-hexyltri-t-butoxysilane; n-decyltrichlorosilane, n-decyltribromosilane, n-decyltrimethoxysilane, n-decyltriethoxysilane, n-decyltriisopropoxysilane, n-decyltri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxysilane; phenyltrichlorosilane, phenyltribromosilane, phenyltrimethoxysilane, phenyltriethoxysilane, phenyltriisopropoxysilane, phenyltri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldichlorosilane, diphenyldibromosilane, diphenyldimethoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyltri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyltri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, mercaptopropyltriisopropoxysilane, γ-mercaptopropyltri-t-butoxysilane; β-(3,4-epoxycyclohexyl)ethyltrimethoxysilane, β-(3,4-epoxycyclohexyl)ethyltriethoxysilane; fluoroalkylsilanes which are generally known as fluorosilane coupling agents and examples of which are listed below; and their hydrolyzed condensates or cohydrolyzed condensates; and their mixtures.

Fluoroalkylsilanes include $CF_3(CF_2)_3CH_2CH_2Si(OCH_3)_3$, $CF_3(CF_2)_5CH_2CH_2Si(OCH_3)_3$, $CF_3(CF_2)_7CH_2CH_2Si(OCH_3)_3$, $CF_3(CF_2)_9CH_2CH_2Si(OCH_3)_3$, $(CF_3)_2CF(CF_2)_4CH_2CH_2Si(OCH_3)_3$, $(CF_3)_2CF(CF_2)_6CH_2CH_2Si(OCH_3)_3$, $(CF_3)_2CF(CF_2)_8CH_2CH_2Si(OCH_3)_3$, $CF_3(C_6H_4)C_2H_4Si(OCH_3)_3$, $CF_3(CF_2)_3(C_6H_4)C_2H_4Si(OCH_3)_3$, $CF_3(CF_2)_5(C_6H_4)C_2H_4Si(OCH_3)_3$, $CF_3(CF_2)_7(C_6H_4)C_2H_4Si(OCH_3)_3$, $CF_3(CF_2)_3CH_2CH_2SiCH_3(OCH_3)_2$, $CF_3(CF_2)_5CH_2CH_2SiCH_3(OCH_3)_2$, $CF_3(CF_2)_7CH_2CH_2SiCH_3(OCH_3)_2$, $CF_3(CF_2)_9CH_2CH_2SiCH_3(OCH_3)_2$, $(CF_3)_2CF(CF_2)_4CH_2CH_2SiCH_3(OCH_3)_2$, $(CF_3)_2CF(CF_2)_6CH_2CH_2SiCH_3(OCH_3)_2$, $(CF_3)_2CF(CF_2)_8CH_2CH_2SiCH_3(OCH_3)_2$, $CF_3(C_6H_4)C_2H_4SiCH_3(OCH_3)_2$, $CF_3(CF_2)_3(C_6H_4)C_2H_4SiCH_3(OCH_3)_2$, $CF_3(CF_2)_5(C_6H_4)C_2H_4SiCH_3(OCH_3)_2$, $CF_3(CF_2)_7(C_6H_4)C_2H_4SiCH_3(OCH_3)_2$, $CF_3(CF_2)_3CH_2CH_2Si(OCH_2CH_3)_3$, $CF_3(CF_2)_5CH_2CH_2Si(OCH_2CH_3)_3$, $CF_3(CF_2)_7CH_2CH_2Si(OCH_2CH_3)_3$, $CF_3(CF_2)_9CH_2CH_2Si(OCH_2CH_3)_3$, and $CF_3(CF_2)_7SO_2N(C_2H_5)C_2H_4CH_2Si(OCH_3)_3$.

Among the above organopolysiloxanes, those containing a number of functional groups which can be crosslink points such as an alkoxyl group or a halogen are preferred from the viewpoint of forming a strong film by crosslinking. Accordingly, in silicon compounds represented by formula $Y_nSiX_{(4-n)}$ wherein Y represents an alkyl, fluoroalkyl, vinyl, amino, phenyl, or epoxy group; X represents an alkoxyl group or a halogen; and n is an integer of 0 to 3, n is preferably small, particularly n=0 is preferred.

Compounds having a skeleton represented by the following general formula may be mentioned as organopolysiloxanes prepared by crosslinking reactive silicone which are excellent in water repellency and oil repellency.

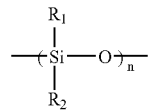

wherein n is an integer of 2 or more; and $R_1$ and $R_2$ each represent a substituted or unsubstituted alkyl, alkenyl, aryl or cyanoalkyl group having 1 to 10 carbon atoms and not more than 40% in terms of molar ratio of the whole thereof is accounted for by vinyl, phenyl, or a phenyl halide. Organopolysiloxanes wherein $R_1$ and $R_2$ represent a methyl group are preferred because the surface energy is the lowest. The content of the methyl group is preferably not less than 60% in terms of molar ratio. In the chain terminal or side chain, one or more reactive groups such as hydroxyl group are contained in the molecular chain.

Further, a stable organosilicon compound, which does not cause any crosslinking reaction, such as dimethylpolysiloxane, may be mixed in combination of the above organopolysiloxane in the binder.

The buffer layer may be formed, for example, by dispersing a metal oxide such as a photocatalyst and a binder optionally together with other additives in a solvent to prepare a solution for buffer layer formation, coating the solution for buffer layer formation onto a substrate with an electrode layer formed thereon, and curing the coating. Preferred solvents usable herein include alcoholic organic solvents such as ethanol and isopropanol. Coating may be carried out by a conventional method such as spin coating, spray coating, dip coating, roll coating, or bead coating. Curing treatment may be heat treatment. However, when a radiation curable component is contained as a binder, the buffer layer may be formed by applying a radiation for curing treatment.

The content of a metal oxide such as a photocatalyst in the solution for buffer layer formation may be in the range of 5 to 60% by mass, preferably 20 to 40% by mass, based on the solid content. The thickness of the buffer layer thus obtained is preferably in the range of 0.05 to 10 μm.

In the first embodiment of the present invention, another method for subjecting the buffer layer to curing treatment is to use a water soluble solution for buffer layer formation. The solution preferably contains a water- or alcohol-soluble or dispersible organic material having a hydrophilic group in its molecule.

A hydroxyl group, a sulfonic acid group, or a carboxylic acid group may be mentioned as the hydrophilic group. Suitable organic materials having a hydrophilic group of this type include salts of poly-3,4-alkenedioxythiophenes with polystyrenesulfonic acid (hereinafter abbreviated to PEDOT/PSS) represented by formula

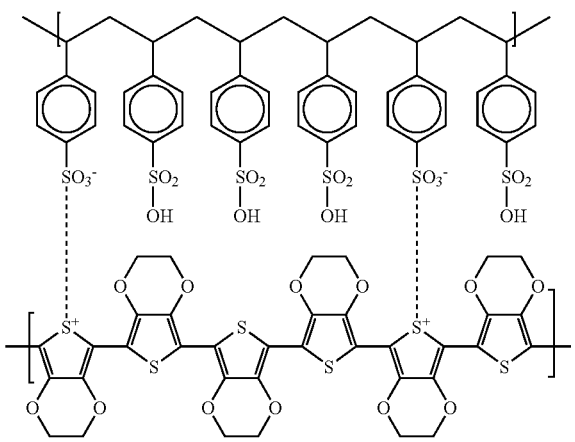

or their derivatives.

Further, in the present invention, the above materials having hole injection properties in which a silane coupling agent has been incorporated may be suitably used as the material for buffer layer formation. The addition of such a specific silane coupling agent can realize curing of the hole injection layer through crosslinking and, at the same time, enable the luminescence efficiency to be maintained or improved.

Suitable silane coupling agents include materials represented by formula

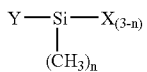

wherein X represents OR wherein R represents an alkyl group; Y represents an epoxy or acryloyl group; and n is an integer of 0 to 2. Further, heating at a temperature of about 80 to 250° C., preferably about 100 to 200° C., can allow a silane coupling reaction to proceed to crosslink and cure the hole injection layer.

In the present invention, as described above, since the buffer layer has been cured, there is no fear of redissolution of the once formed buffer layer in the solution for second buffer layer formation which is coated after that.

The content of the silane coupling agent in the solution for buffer layer formation is preferably not less than 0.5% by weight. When the content of the sliane coupling agent is not less than 0.5% by weight, the buffer layer can be more effectively cured.

(2) Production Process in Second Embodiment of Invention

In the second embodiment of the present invention, the first buffer part can be rendered immiscible with the solution for second buffer layer formation by providing the step of varying the solubility of the buffer layer. Here varying the solubility of the buffer layer is to vary the polarity of a solvent in which the main component of the material for buffer layer formation is dissolved or dispersed. When the solubility of the buffer layer is varied, the polarity of a solvent in which the buffer part, which has already been formed as a buffer layer and patterned, is soluble is different from the polarity of the solvent for the solution for buffer layer formation are different from each other in polarity. The level of a change in solubility may be such that, in the difference in polarity, they are substantially neither dissolvable nor miscible with each other. This can be judged using, as an index, such a state that, when the buffer layer after undergoing a change in solubility is brought into contact with a solvent constituting the solution for buffer layer formation for one min, the solubility is not more than 0.001 (g/g-solvent) under conditions of 25° C. and 1 atm.

Preferably, the material for buffer layer formation contains at least a material which undergoes a change in solubility upon exposure to heat or radiation energy. Specific examples of suitable materials of which the solubility can be varied include materials for buffer layer formation in which a part or all of hydrophilic groups in a hydrophilic organic material are converted to oleophilic groups and a part or all of the oleophilic groups are returned to hydrophilic groups by using heat or radiation energy.

The conversion of hydrophilic groups to oleophilic groups and the conversion of oleophilic groups to hydrophilic groups are not always required for all the groups. For example, in the conversion of hydrophilic groups to oleophilic groups, the conversion may be on the minimum level that solubility of a desired concentration or higher in a nonaqueous general-purpose organic solvent can be maintained. Specifically, the convention may be such that a hydrophilic organic material which is soluble or dispersible in water or an alcoholic solvent is chemically treated to bring the solubility of the chemically treated material to not less than 0.5% by mass in a nonaqueous general-purpose solvent such as toluene, xylene, ethyl acetate, cyclohexanone or the like.

On the other hand, reconversion of oleophilic groups to hydrophilic groups may be on the minimum level that, in stacking a different layer such as a luminescent layer by coating on the buffer layer, or in the case of the formation of the first buffer layer followed by coating of the material for the formation of the adjacent buffer layer, the buffer layer is not eluted in the solvent for coating. For example, the level of reconversion may be such that the organic material buffer layer, which has been chemically converted so that the solubility in toluene, xylene, ethyl acetate, cyclohexanone or the like is not less than 0.5% by mass, is reconverted to such a form that is insoluble in a general-purpose solvent for coating such as toluene, xylene, ethyl acetate, or cyclohexanone, or to such a hardly soluble form that is imcompatible with the general-purpose solvent for coating upon contact for a short period of time, and there is no need to fully return the organic material to the original hydrophilic organic material.

From the viewpoint of forming a buffer layer with a charge injection/transport capability, the hydrophilic organic material is preferably a material that is a hydrophilic hole transport material and, in use, is dispersible or dissolvable. Specific examples of hole transport materials include polyalkylthiophene derivatives, polyaniline derivatives, triphenylamine derivatives, triphenyldiamine derivatives, pyrazoline derivatives, arylamine derivatives, and stilbene derivatives.

Among them, salt-free sulfonic acid group, carboxylic acid group, and hydroxyl group are preferred as hydrophilic groups from the view point of easiness on the conversion reaction.

Polystyrenesulfonic acid and its derivatives or organic materials containing them, or polythiophenesulfonic acid and its derivative or organic materials containing them are preferred as the hydrophilic organic material from the viewpoints of suitability for buffer layer, resistance to conversion treatment, easiness on purification, and cost.

Means for converting hydrophilic groups in the hydrophilic organic material to oleophilic groups is preferably a protection reaction because, upon exposure to heat energy or a radiation, a part or the whole of the oleophilic groups is returned to the hydrophilic groups. The protection reaction refers to a reaction which derivatizes hydrophilic groups to temporarily introduce a protective group into the hydrophilic groups. The protection reaction is preferably at least one reaction selected from the group consisting of esterification, acetylation, tosylation, triphenylmethylation, alkylsilylation, and alkylcarbonylation.

Specifically, for example, a method may be adopted in which at least a part of sulfone groups or carboxyl groups is converted with a chlorinating agent such as phosphorus pentaoxide or thionyl chloride to a sulfochloride group or a carbonylchloride group and an alcohol such as methanol or ethanol is reacted with the chloride for esterification. The above reaction is one example of the conversion means, and the method for rendering the hole transport material in the present invention oleophilic is not limited to the above method.

In the second embodiment of the present invention, an hydrophilic organic material, such as a hole transport material, which has been rendered oleophilic as described above, is dissolved or dispersed in an organic solvent, for example, chloroform, methylene chloride, dichloroethane, tetrahydrofuran, acetone, or ethyl acetate, to prepare a solution for buffer layer formation. The concentration of the hydrophilic organic material such as a hole transport material in the solution for buffer layer formation varies depending upon the ingredients or composition of the hydrophilic organic material. In general, however, the hydrophilic organic material is dissolved or dispersed in the solvent to a concentration of not less than 0.1% by mass, preferably about 1 to 5% by mass. A coating film, that is, a buffer layer, is formed by coating the solution for buffer layer formation thus obtained onto the substrate and drying the coating.

The application of heat or radiation energy to the buffer layer thus formed causes the elimination of the protective group introduced by the protection reaction, and the eliminated protective group is volatilized. Upon the elimination of the protective group, the solubility of the organic material contained in the material for buffer layer formation which was oleophilic is rendered hydrophilic, and, consequently, the organic material no longer is miscible with the solution for the oleophilic buffer layer formation.

Specifically, for example, upon the application of heat or radiation energy, the ester bond is decomposed, and the esterified sulfone group and/or carboxyl group is returned to a sulfone group or carboxyl group in a free or salt form. The heat energy can be applied, for example, by heating at a temperature of about 200 to 220° C. for about 60 to 90 min. This heat treatment may be carried out simultaneously with heat drying after coating of the solution for buffer layer formation. Radiations usable herein include, for example, ultraviolet light and electron beams. Regarding irradiation conditions, for example, ultraviolet light (wavelength: not more than 400 nm) of about 200 to 250 mJ/cm$^2$ may be applied. On the other hand, electron beams may be applied, for example, under conditions of not less than 500 kV and 35 mA.

The thickness of the buffer layer thus formed is generally about 100 to 2000 angstroms.

The solvent used in the solution for buffer layer formation is not particularly limited so far as the buffer material is dispersed or dissolved in the solvent. In the present invention, however, since patterning by photolithography is repeated twice or more to form a second buffer layer in a region including the already patterned first pattern part, the solvent for buffer layer formation should be a solvent that does not dissolve the photoresist layer or luminescent layer as the uppermost layer in the pattern part. The solvent for buffer layer formation usable in the present invention may be such that the solubility of the resist material and the solubility of the material for luminescent layer formation satisfies the above solubility requirement. Any solvent satisfying the above requirement is usable, and, further, two or more solvents may be used as a mixture.

Electroluminescent (EL) Layer

In the present invention, the EL layer may comprise a hole transport layer, a hole injection layer, an electron transport layer, an electron injection layer and the like. However, the EL layer comprises at least a buffer layer and a luminescent layer that have been patterned. The patterning can realize an area color or a full color display element and, further, can improve carrier injection balance in the EL element, and, thus, best use of the effect of the present invention can be made.

Specifically, in a preferred embodiment of the EL layer, a buffer layer patterned by photolithography is provided as the EL layer on the first electrode layer, a luminescent layer patterned by photolithography is provided as the EL layer on the buffer layer, and a second electrode layer is further provided on the luminescent layer. Most preferred is a full-color EL element in which the luminescent layer exhibits luminescence of three colors of RGB or the like formed by patterning using photolithography three times.

The present invention is characterized in that, in patterning the EL layer, patterning is carried out by photolithography. The other layers may be formed by conventional methods. The photolithography is a method in which a change in solubility of a film in its light exposed part upon light irradiation is utilized to form any desired pattern according to a light irradiation pattern.

Unlike conventional vapor deposition conducted through a shadow mask, patterning using photolithography does not require the use of a vacuum device and the like and thus is advantageous in that the EL layer can be patterned in an easy and inexpensive manner. Further, unlike patterning by ink jet printing, in photolithography, high-definition patterning can be carried out, for example, without the need to conduct pretreatment of the base and to provide liquid-repellent convex parts between patterns. That is, the provision of the step of patterning at least one EL layer by photolithography enables a high-quality EL element having a high-definition pattern to be provided at low cost.

The steps in the production of an electroluminescent element according to the present invention will be described with reference to the accompanying drawings.

In the step of forming a first pattern part including a first buffer part as the lowermost layer, for example, as shown in FIG. 2(a), a solution for first puffer layer formation is coated onto a substrate 1 having an electrode and optionally provided with a pattern already formed without the use of photolithography so as to form a buffer layer as the lowermost layer, and the coating is dried to form a buffer layer 2. As shown in FIG. 2(b), a luminescent layer 3 is further formed on the buffer layer 2, and a photoresist layer 4 is stacked on the luminescent layer 3. Subsequently, as shown in FIG. 2(c), a photomask 8 is masked on the assembly only in its part where the first luminescent part is to be formed, and the other part is exposed to ultraviolet light 9.

The exposed assembly is developed with a photoresist developing solution and is washed to remove the photoresist layer in its exposed part as shown in FIG. 2(d). As shown in FIG. 2(e), the part from which the photoresist layer has been removed to expose the luminescent layer is further removed by etching to form a first pattern part 5 including the first buffer part 2 as the lowermost layer.

Next, the step of coating a solution for the formation of a second buffer layer as the lowermost layer in the region including the first pattern part is carried out. In this step, for example, as shown in FIG. 2(f), for forming the lowermost layer, the top of the substrate 1, that has first pattern part 5, including the first buffer part 2 as the lowermost layer, provided on the substrate having the electrode and optionally provided with the pattern already formed without the use of photolithography, is first coated with a solution 6(1) for second buffer layer formation so as to include the region including the first pattern part 5 and the region where a second pattern part is to be formed, generally on the whole area in a given range on the substrate.

The coated solution for buffer layer formation is dried in the same manner as described above to form a second buffer layer 6. In this case, in order that a combination of the first buffer part with the solution for second buffer layer formation is that the first buffer part is immiscible with the solution for second buffer layer formation, when the first embodiment is used, the step of curing the buffer layer is preferably carried out in at least the step of forming the first pattern part including the first buffer part as the lowermost layer, and, the step of curing the buffer layer is included after the formation of the first buffer layer and before patterning. When the step of forming the pattern part is carried out by n (wherein n is 2 or more) photolithography, the step of curing the buffer layer is preferably included in the step of forming the pattern part using at least 1st to (n−1)th photolithography.

Further, in order that a combination of the first buffer part with the solution for second buffer layer formation is such that the first buffer part is immiscible with the solution for second buffer layer formation, in the second embodiment of the present invention, the step of varying the solubility of the buffer layer is preferably included after the coating of the solution for second buffer layer formation in which at least the solubility has been previously changed and before patterning. When, also in the step of forming the first buffer part, the solution for buffer layer formation in which the solubility has been previously changed as in the solution for second buffer layer formation, the step of varying the solubility of the buffer layer should also be carried out in the step of forming the first pattern part. In this case, preferably, the step of varying the solubility of the buffer layer is included in a stage after the formation of the first buffer layer and before patterning.

In the second embodiment, in all the steps of forming buffer parts using the solution for buffer layer formation in which the solubility has been previously varied, the step of varying the solubility of the buffer layer is preferably provided to vary the solubility and thus to return the buffer layer to such an original state that original charge transfer and injection functions are provided.

Next, in the production of a full-color EL element, an embodiment of the step of patterning a buffer layer and a luminescent layer by three-time photolithography according to the production process of the present invention will be described.

At the outset, as described above, as shown in FIG. 2(a), a solution for first buffer layer formation is coated onto a substrate 1, having an electrode and optionally provided with a pattern already formed without use of photolithography, so as to form a buffer layer as the lowermost layer, and the coating is then dried to form a buffer layer 2. In the first embodiment of the present invention, the buffer layer is cured by using heat and/or radiation energy. On the other hand, in the second embodiment of the present invention, when the solution for first buffer layer formation used a material of which the solubility was previously varied, the solubility of the buffer layer is varied by using heat and/or radiation energy.

As shown in FIG. 2(b), a luminescent layer 3 is further formed on the buffer layer 2, and a photoresist layer 4 is stacked on the luminescent layer 3. Subsequently, as shown in FIG. 2(c), a photomask 8 is masked on the assembly only in its part where the first luminescent part is to be formed, and the other part is exposed to ultraviolet light 9.

The exposed assembly is developed with a photoresist developing solution and is washed to remove the photoresist layer in its exposed part as shown in FIG. 2(d). As shown in FIG. 2(e), the part from which the photoresist layer has been removed to expose the luminescent layer is further removed by etching to form a first pattern part 5 including the first buffer part 2 as the lowermost layer. Here, in the present invention, preferably, the step is transferred to the step of forming the second pattern part in such a state that the photoresist layer located on the uppermost layer of the first pattern part remains unpeeled. This is because, in the step of forming the second pattern part, in etching the luminescent layer and the buffer layer, the photoresist layer functions to protect the first luminescent part so as to avoid the influence of the etching. Further, peeling off the photoresist layers at a time at the final stage of the step of forming a pattern part which is repeated twice or more is efficient.

Next, as shown in FIG. 2(f), in order to form the lowermost layer of the second pattern part, at the outset, a solution 6(1) for second buffer layer formation is coated so as to include the region including the first pattern part 5 and the region where the second pattern part is to be formed. In the present invention, a combination of the first buffer part with the solution for second buffer layer formation is that the first buffer part is immiscible with the solution for second buffer layer formation. Therefore, when the solution 6(1) for second buffer layer formation is coated, the end part of the first pattern part 5 is not eluted in the solution 6(1) for second buffer layer formation.

Subsequently, the solution 6(1) for buffer layer formation is dried, and, when the first embodiment is used, the buffer layer is cured by using heat energy and/or a radiation. Further, when the second embodiment is used, the solubility of the buffer layer is varied by using heat energy and/or a radiation. Thus, the second buffer layer 6, which is insoluble in the same solution for buffer layer formation as in the first buffer layer, is formed (FIG. 2(g)).

Subsequently, in the same manner as described above, the solution for second luminescent layer formation is coated to form a second luminescent layer 7. In this case, even when the solution for second luminescent layer formation is coated, since the second buffer layer 6 functions as a protective layer, the end part of the first luminescent part is not eluted in the solution for second luminescent layer formation. A positive working photoresist is coated on the whole area of the assembly to form a photoresist layer 4' for a second pattern part (FIG. 2(h)).

Next, as shown in FIG. 2(i), in the same manner as described above, only the position where a second luminescent part is to be formed is masked by a photomask 8, and ultraviolet light 9 is applied to positions other than the position where the second luminescent part is to be formed. The photoresist layer 4' for a second pattern part is developed with a photoresist developing solution and is washed, whereby the photoresist layer 4' for a second pattern part remains unremoved only in the part where the second luminescent part is to be formed (FIG. 2(*j*)).

As shown in FIG. 2(*k*), the part where the photoresist layer was removed to expose the luminescent layer is further removed by etching to form a second pattern part 10 including the second buffer part 6 as the lowermost layer.

Next, the luminescent part for the third color is patterned. As shown in FIG. 2(*l*), in order to form the lowermost layer of the third pattern part, the solution 11(1) for third buffer layer formation is first coated onto the substrate 1 so as to include the region including the first pattern part 5 and the second pattern part 10 and the region where the third pattern part is to be formed. In the present invention, a combination of the already formed first and second buffer parts with the solution for third buffer layer formation is such that the already formed first and second buffer parts are immiscible with the solution for third buffer layer formation. Therefore, when the solution 11 (1) for third buffer layer formation is coated, the end part of the first pattern part 5 and the second pattern part 10 is not eluted in the solution 11(1) for third buffer layer formation.

The solution 11(1) for third buffer layer formation is then dried, and, as with the step of forming the second pattern part, the buffer layer is cured by using heat energy and/or a radiation, or alternatively the solubility of the buffer layer is varied, whereby a third buffer layer 11 is formed (FIG. 2(*m*)).

The solution for third luminescent layer formation is then coated in the same manner as described above to form a third luminescent layer 12. In this case, even when the solution for third luminescent layer formation is coated, since the second buffer layer 11 functions as a protective layer, the end part of the first luminescent part and the end part of the second luminescent part are not eluted in the solution for third luminescent layer formation. A positive working photoresist is coated on the whole area of the assembly to form a photoresist layer 4" for a third pattern part (FIG. 2(*n*)).

As shown in FIG. 2(*o*), in the same manner as described above, only the position where the third luminescent part is to be formed is masked by a photomask 8, and ultraviolet light 9 is applied to positions other than the position where the third luminescent part is to be formed. The photoresist layer 4" for a third pattern part is developed with a photoresist developing solution and is washed, whereby the photoresist layer 4" for a third pattern part remains unremoved only in the part where the third luminescent part is to be formed (FIG. 2(*p*)).

As shown in FIG. 2(*q*), the part where the photoresist layer was removed to expose the luminescent layer is further removed by etching to form a third pattern part 13 including the third luminescent part 12 with the third buffer part 11 provided as the lowermost layer.

Finally, as shown in FIG. 2(*r*), each photoresist layer located on the uppermost layer is peeled off (step of peeling), and a second electrode layer is formed on each of the exposed luminescent layers to produce an EL element which emits light downward in the drawing.

When the solution for the formation of a buffer layer as the lowermost layer is coated, the buffer layer can be formed without causing adjacent buffer layers to be miscible with each other. Further, since the buffer layer as the lowermost layer functions as a protective layer for the already formed pattern part, the adjacent luminescent layers are not miscible with each other, and, in this way, an electroluminescent layer can be formed. Accordingly, in the electroluminescent element according to the present invention, without the need to form a secondary photoresist layer (a protective layer) for covering the end part of the patterned part, the unfavorable phenomenon that the end part of the patterned part is eluted in the later coated coating liquid resulting in luminescence failure due to cross contamination or a change in layer thickness can be prevented. Therefore, the electroluminescent element according to the present invention is an element comprising a plurality of types of high-definition patterns that have been formed relatively easily and at low cost.

Further, the EL element produced using the photolithographic process has the following features which are different from the features of EL elements produced by other processes.

At the outset, unlike other processes, in the photolithography, a film is once coated on the whole area, and the film in its unnecessary part is removed by etching. Therefore, the EL element produced using the photolithography is characterized by the shape 12 of the end part of the EL layer (see FIG. 3(*a*)). In the conventional processes such as vapor deposition and coating, as shown in FIG. 3(*b*), a slope of layer thickness occurs at the end part, and the width of the layer thickness nonuniform region is wide. On the other hand, in the photolithography, since patterning is carried out by etching, as shown in FIG. 3(*a*), the layer thickness at the end part is equal or similar to the layer thickness at the center part, that is, the width of the layer thickness nonuniform region at the end part is advantageously not more than 15 µm, preferably not more than 10 µm, particularly preferably not more than 7 µm. The term "layer thickness nonuniform region" refers to a region where the layer thickness is not more than 90% of the average layer thickness of the flat part.

Further, for example, in the ink jet printing, a structure called a partition wall is necessary (FIG. 3(*c*)), and, thus, the EL layer is received within an insulating layer or the partition walls. On the other hand, the photolithography is characterized in that none of the petition walls, the construct for aiding the patterning and the surface treatment for aiding the patterning are provided and that the end part of the EL layer is formed on an insulating layer.

Next, individual members and the like used in each of the above production steps will be described.

(1) Photoresist

The photoresist used in the present invention may be either positive working type or negative working type and is not particularly limited. Preferably, however, the photoresist is soluble in a solvent, which does not dissolve the underlying layer, is coatable, and is insoluble in a solvent which is used in the formation of an EL layer such as a buffer layer and a luminescent layer.

Specific examples of photoresists usable herein include novolak resins and rubber+bisazide.

(2) Photoresist Solvent

In the present invention, preferably, the photoresist solvent used in coating the photoresist does not dissolve materials for EL layer formation such as a material for a buffer layer and a material for a luminescent layer from the viewpoints of preventing the EL layer such as a buffer layer and a luminescent layer in the formation of the photoresist film and the photoresist material from being mixed or dissolved in each other and maintaining original luminescence characteristics. When this point is taken into consideration, the photoresist solvent usable in the present invention preferably has a solubility in the material for EL layer formation such as a material for a buffer layer of not more than 0.001 (g/g-solvent), more preferably not more than 0.0001 (g/g-solvent), under conditions of 25° C. and 1 atm. In general, in order to prevent mixing or dissolution in underlying layer, preferably, all the following cases satisfy the solubility requirement.

For example, photoresist solvents usable in the case where the material for buffer layer formation is dissolved in an aqueous solvent and the luminescent layer is dissolved in a nonpolar organic solvent such as an aromatic nonpolar organic solvent include: ketones including acetone and methyl ethyl ketone; cellosolve acetates including propylene glycol monoethyl ether acetate, propylene glycol monomethyl ether acetate, ethylene glycol monomethyl ether acetate, and ethylene glycol monoethyl ether acetate; cellosolves including propylene glycol monoethyl ether, propylene glycol monomethyl ether, ethylene glycol monomethyl ether, and ethylene glycol monoethyl ether; alcohols including methanol, ethanol, 1-butanol, 2-butanol, and cyclohexanol; ester solvents such as ethyl acetate and butyl acetate; cyclohexanone; and decalin. Other solvents may also be used so far as they satisfy the above requirements. A mixed solvent composed of two or more solvents may also be used.

(3) Photoresist Developing Solution

The photoresist developing solution usable in the present invention is not particularly limited so far as it does not dissolve the material for EL layer formation. Specifically, organic alkaline developing solutions commonly used in the art may be used. Other developing solutions such as aqueous inorganic alkali solutions or aqueous solutions which can develop the resist can be used. After the development of the resist, washing with water is preferred.

A developing solution in which the solubility of the material for EL layer formation such as a luminescent layer material therein satisfies the solubility requirements may be used in the present invention.

(4) Photoresist Peeling Liquid

Further, the photoresist peeling liquid usable in the present invention should dissolve the photoresist layer rather than the dissolution of the EL layer, and the above photoresist solvent as such may be used. When the positive working resist is used, a method may also be adopted in which, after UV exposure, the liquid mentioned as the resist developing solution may be used for peeling.

Further, strongly alkaline aqueous solutions, solvents such as dimethylformamide, dimethylacetamide, dimethylsulfoxide, N-methyl-2-pyrrolidone, and mixtures thereof and commercially available resist peeling liquids may also be used. After peeling of the resist, rinsing with 2-propanol or the like and further rinsing with water may be carried out.

(5) Patterning by Photolithography

Regarding patterning by photolithography used in the present invention, specifically, when a positive working photoresist is used, at the outset, the EL layer is formed on the whole area, a photoresist solution prepared by dissolving the photoresist material in the photoresist solvent is then coated onto the whole area thereof, and the coating is dried to form a photoresist layer. Next, the photoresist layer is exposed pattern-wise, and the photoresist in its exposed part is developed with the above resist developing solution. Upon the development, only the photoresist in its unexposed part remains unremoved. The EL layer in its part not covered by the photoresist is removed to pattern the EL layer.

The method for forming the EL layer such as the buffer layer and the luminescent layer on the whole area may be the same as the formation of the conventional EL layer and is not particularly limited. Examples thereof include vapor deposition and, in addition, electrodeposition, and coating methods using a melt, solution, or mixed liquid of the material, for example, spin coating, casting, dipping, bar coating, blade coating, roll coating, gravure coating, flexography, and spray coating. Among others, wet film formation methods such as coating are preferred from the viewpoint of utilizing an advantage that patterning can be carried out without use of mask vapor deposition.

Methods for removing the EL layer in its part not covered by the photoresist are divided into wet methods using solvents or the like and dry methods. In the present invention, dry etching (dry method) characterized by anisotropy is preferred. Accordingly, patterning by photolithography is preferably carried out by coating a photoresist onto the EL layer to be patterned, exposing and developing the coating to pattern the photoresist, and then removing, by a dry etching process, the electroluminescent layer in its part where the photoresist has been removed. When the electroluminescent layer in its part where the photoresist has been removed is removed by the dry etching process, the end part of the etching can be made sharper. Therefore, the width of the layer thickness nonuniform region present in the end part of the pattern can be further reduced, and, consequently, higher-definition patterning can be realized.

Reactive ion etching is preferred as the drying etching method. When the reactive ion etching is used, the organic material undergoes a chemical reaction to give a compound having a low molecular weight that can be removed from the substrate by volatilization or vaporization, and, thus, fabrication can be carried out with high etching accuracy in a short time.

In the dry etching, the use of oxygen as a simple substance or oxygen-containing gas is preferred. The use of oxygen as a simple substance or oxygen-containing gas can realize the decomposition and removal of the organic luminescent layer by an oxidation reaction, can realize the removal of unnecessary organic matter from the substrate, and can realize fabrication with high etching accuracy in a short time. Under the above conditions, a commonly used oxide transparent conducting film such as ITO is not etched. This is also advantageous in that the surface of the electrode can be cleaned without sacrificing the electrode characteristics.

Further, atmospheric pressure plasma is preferably used in the dry etching. When the atmospheric pressure plasma is used, dry etching which usually requires the use of a vacuum apparatus can be carried out under the atmospheric pressure and, thus, shortening of the treatment time and a reduction in cost can be realized. In this case, etching can utilize a phenomenon that the organic material is oxidatively decomposed by oxygen in the plasmatized air. The gas composition of a reaction atmosphere can be regulated as desired by gas substitution and circulation.

(6) Luminescent Layer

In the present invention, the luminescent layer is preferably an organic luminescent layer and is generally composed mainly of an organic material (a low molecular compound and a high molecular compound) capable of emitting fluorescence or phosphorescence and a dopant as an assistant.

In the present invention, when the luminescent layer on the buffer layer is formed by patterning using photolithography, a material, which is insoluble in the above photoresist solvent and the solvent for the solution for buffer layer formation, is preferably selected as the material for luminescent layer formation. More preferably, the material for luminescent layer formation is insoluble in the photoresist peeling liquid.

For example, the following materials may be mentioned as the material for luminescent layer formation usable in the present invention.

<Coloring Matter Material>

Coloring matter materials include, for example, cyclopentamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, trifumarylamine derivatives, oxadiazole dimers, and pyrazoline dimers.

<Metal Complex Material>

Metal complex materials include, for example, quinolinol aluminum complexes, benzoquinolinol beryllium complexes, benzoxazolyl zinc complexes, benzothiazole zinc complexes, azomethyl zinc complexes, porphyrin zinc complexes, europium complexes and the like, and metal complexes comprising Al, Zn, Be or the like or a rare earth metal such as Tb, Eu, or Dy as a central metal having an oxadiazole, thiadiazole, phenylpyridine, phenylbenzimidazol, or quinoline structure as a ligand.

<Polymeric Material>

Polymeric materials include polyparaphenylenevinylene derivatives, polythiophene derivatives, polyparaphenylene derivatives, polysilane derivatives, polyacetylene derivatives, polyfluorene derivatives, polyvinylcarbazole derivatives, and materials prepared by polymerizing the above coloring matter or metal complex luminescent materials.

Among the above luminescent materials, blue light emitting materials include distyrylarylene derivatives, oxadiazole derivatives, and their polymers, polyvinylcarbazole derivatives, polyparaphenylene derivatives, and polyfluorene derivatives. Among them, polyvinylcarbazole derivatives, polyparaphenylene derivatives, polyfluorene derivatives and the like as polymeric materials are preferred.

Green light emitting materials include quinacridone derivatives, coumarin derivatives, and their polymers, polyparaphenylenevinylene derivatives, and polyfluorene derivatives. Among them, polyparaphenylenevinylene derivatives, polyfluorene derivatives and the like as polymeric materials are preferred.

Red light emitting materials include coumarin derivatives, thiophene ring compounds, and their polymers, polyparaphenylenevinylene derivatives, polythiophene derivatives, and polyfluorene derivatives. Among them, polyparaphenylenevinylene derivatives, polythiophene derivatives, polyfluorene derivatives and the like as polymeric materials are preferred.

<Dopant Material>

A dopant may be incorporated in the luminescent layer, for example, from the viewpoints of improving luminescence efficiency and varying luminescence wavelength. Such dopants include, for example, perylene derivatives, coumarin derivatives, rubrene derivatives, quinacridone derivatives, squalium derivatives, porphyrin derivatives, styryl coloring matters, tetracene derivatives, pyrazolone derivatives, decacyclene, and phenoxazone.

The thickness of the luminescent layer is generally about 20 to 2000 angstroms.

When the luminescent layer is formed on the buffer layer by photolithography, preferably, the solvent for the solution for luminescent layer formation prevents the buffer layer and the material for luminescent layer formation from being mixed or dissolved in each other in the formation of the luminescent layer and does not dissolve the buffer layer. For this reason, the solvent for the solution for luminescent layer formation may be such that the solubility of the buffer layer in the solvent for the solution for luminescent layer formation satisfies the above solubility requirement.

For example, in the production process in the first embodiment, the buffer layer is cured and thus is rendered insoluble in the solvent. Therefore, the solvent for the solution for luminescent layer formation is not particularly limited. Preferably, however, the first buffer layer is formed from a water soluble coating liquid for buffer layer formation, and the first luminescent layer is formed from a nonaqueous coating liquid for luminescent layer formation.

In the production process in the second embodiment, the solvent used in the solution for luminescent layer formation is not particularly limited so far as the solvent satisfies the above solubility requirement that the buffer part after varying the solubility is less likely to be dissolved in the solvent, and, at the same time, the solubility of the material for luminescent layer formation in the solvent is high. Such solvents include organic solvents, for example, aromatic solvents including isomers of benzene, toluene and xylene and mixtures thereof, and isomers of mesitylene, tetralin, p-cymene, cumene, ethylbenzene, diethylbenzene, butylbenzene, chlorobenzene, and dichlorobenzene, and mixtures thereof, ether solvents including anisole, phenetole, butyl phenyl ether, tetrahydrofuran, 2-butanone, 1,4-dioxane, diethyl ether, diisopropyl ether, diphenyl ether, dibenzyl ether, and diglyme, chloro solvents such as dichloromethane, 1,1-dichloroethane, 1,2-dichloroethane, trichloroethylene, tetrachloroethylene, chloroform, carbon tetrachloride, and 1-chloronaphthalene, and cyclohexanone. Other solvents may also be used so far as the above requirements are satisfied. Further, a mixed solvents composed of two or more solvents may also be used.

(7) Charge Transport/Injection Layer

In the EL element according to the present invention, a hole transport layer, a hole injection layer, an electron transport layer, and an electron injection layer may be provided. These layers are not particularly limited so far as they are commonly used in conventional EL element, for example, those described in Japanese Patent Laid-Open No. 4011/1999.

(8) Substrate

The substrate is a support for an EL element and may be formed of, for example, a flexible material or a rigid material. The substrate for an EL element used in the present invention is not particularly limited and may be, for example, a glass or plastic sheet substrate used in conventional EL elements. The thickness of the substrate is generally about 0.1 to 2.0 mm.

(9) First and Second Electrodes

In the present invention, a first electrode is provided on the substrate, and a second electrode is provided on the EL layer. These electrodes are an anode and a cathode. The electrode located in the direction of takeout of light emitted from the EL layer should be transparent, and at least one of the first and second electrodes should be formed of a transparent or semi-transparent material.

The electrode is formed of an electrically conductive material and preferably has the lowest possible resistance. The electrode is generally formed of a metal material, or alternatively may be formed of an organic compound or an inorganic compound. Further, the electrode may be formed of a mixture of a plurality of materials.

The anode is preferably formed of an electrically conductive material having a large work function from the viewpoint of easiness on hole injection. Preferred anode materials include, for example, indium oxide and gold.

The cathode is preferably formed of an electrically conductive material having a small work function from the viewpoint of easiness on electron injection. Preferred cathode materials include, for example, magnesium alloys (for example, Mg—Ag), aluminum alloys (for example, Al—Li, Al—Ca, and Al—Mg), metallic calcium and metals having a small work function. The thickness of each of the electrode layers is generally about 20 to 1000 angstroms.

(10) Insulating Layer

In the EL element according to the present invention, in order to cover the patterned edge part in the first electrode layer formed on the substrate and the nonluminescent part in the element and thus to prevent short-circuiting at the part unnecessary for luminescence, an insulating layer may be previously provided so that the insulating layer in its luminescence part is in the form of an opening. This can reduce defects attributable to short-circuiting of the element and can realize an element that has a long service life and can stably emit light.

This insulating layer may be formed, for example, by forming a pattern having a layer thickness of about 1 μm using an ultraviolet curable resin or the like. In the present invention, when the luminescent layer is patterned by dry etching, the insulating layer is preferably resistant to dry etching. When the resistance to dry etching is low, a layer having a thickness of not less than 1 μm, for example, 1.5 to 10 μm, is preferably formed to avoid a loss upon dry etching. More preferably, the layer is formed in a thickness of 2 to 5 μm.

The organic EL element according to the present invention may have, but not limited to, the following constructions.

First electrode/buffer layer (hole injection layer/luminescent layer)/second electrode First electrode/buffer layer (hole injection layer/luminescent layer/electron injection layer)/second electrode First electrode/buffer layer (hole injection layer/electron blocking layer/luminescent layer/electron injection layer)/second electrode First electrode/buffer layer (hole injection layer/electron blocking layer/luminescent layer/hole blocking layer/electron injection layer)/second electrode In the present invention, since the buffer layer is immiscible with solutions for buffer layer formation, each layer may be formed by using other solutions including solvents compatible with these solutions (for example, a solution for electron injection layer formation and a solution for electron blocking layer formation). In particular, when PEDOT/PPS is used as the material for hole injection layer formation, water or an alcoholic solvent is used in the coating liquid. The individual layers may be formed from coating liquids for each layer formation using water or alcoholic water-soluble solvents. For example, PEDOT/PPS is generally in a negatively charged state, and each functional layer may be formed on the hole injection layer by adsorbing a positively charged water soluble material on the hole injection layer formed of PEDOT/PPS and optionally further adsorbing a negatively charged material.

Regarding doping into the PEDOT/PPS hole injection layer, washing with an alcoholic or cellulosic solvent may be followed by doping into the hole injection layer to improve the luminescence efficiency of the organic EL element.

The electron blocking layer provided between the hole injection layer and the luminescent layer may be formed by, after the hole injection layer formation, immersing the substrate in an aqueous tetramethoxysilane solution and drying the substrate. Further, the electron blocking layer may also be formed by utilizing a self-organization method. Specifically, a method may be adopted in which the substrate is alternately immersed in aqueous polymer solutions different from each other in charge to alternately stack these polymers on top of each other by electrostatic adsorption effect (Nature 404, p. 481 (2000) P.K.H. Ho et al.). When this self-organization method is utilized, the electrically conductive material and the semiconductor material can be alternately stacked and, thus, a stepwise gradient of hole injection from the anode into the luminescent material can be provided. This is attributable to the fact that a material having a wide bandgap disposed at the interface of the luminescent layer functions also as an electron blocking layer.

The hole blocking layer is provided between the luminescent layer and the electron injection layer. The hole blocking layer may be formed, for example, by, after the luminescent layer formation, immersing the substrate in a solution of a water soluble resin of polystyrenesulfonic acid with metal ions (for example, sodium or lithium ions) coordinated thereto. According to the present invention, after the patterned luminescent layer formation, the substrate can be immersed in the above solution to form a hole blocking layer on the whole area of the substrate.

EXAMPLES

The following Examples further illustrate the present invention. However, it should be noted that the present invention is not limited to these Examples.

Example 1

(Formation of First Buffer Layer)

A patterned ITO substrate having a size of 6 in. square and a thickness 1.1 mm was cleaned and was used as a base and a first electrode layer. A photocatalyst-containing solution for first buffer layer formation having the following composition was spin coated onto this substrate, and the coating was heated and dried at 150° C. for 10 min to allow hydrolysis and polycondensation to proceed and to cure the coating. Thus, a 200 angstrom-thick transparent photocatalyst-containing layer was formed in which a photocatalyst had been firmly fixed in organosiloxane.

(Composition of Solution for First Buffer Layer Formation)

| | |
|---|---|
| Titanium dioxide (ST-K01, manufactured by Ishihara Sangyo Kaisha Ltd.) | 2 parts by mass |
| Organoalkoxysilane (TSL 8113, manufactured by Toshiba Silicone Co., Ltd.) | 0.4 part by mass |
| Fluoroalkylsilane (MF-160 E, manufactured by Tohchem Products Corporation) | 0.3 part by mass |
| isopropyl alcohol | 3 parts by mass |

The buffer layer (photocatalyst-containing layer) was irradiated with ultraviolet light at 70 mW/cm$^2$ from a mercury vapor lamp (wavelength 365 nm) for 50 sec. As a result, a hydrophilic surface having a contact angle with water of not more than 10 degrees could be obtained.

(Formation of First Luminescent Layer)

For first luminescent layer formation, one ml of a coating liquid as a red light emitting organic material (comprising 70 parts by mass of polyvinylcarbazole, 30 parts by mass of oxadiazole, 1 part by mass of a dicyanomethylenepyran derivative, and 4900 parts by mass of monochlorobenzene) was placed dropwise on the buffer layer in its part corresponding to the center part of the substrate to perform spin coating. Layer formation was carried out by holding at 2000 rpm for 10 sec. As a result, the thickness of the layer thus formed was 800 angstroms.

A positive-working photoresist liquid (OFPR-800, manufactured by Tokyo Ohka Kogyo Co., Ltd.) (2 ml) was placed dropwise at the center part of the base to perform spin coating. Layer formation was carried out by holding at 500 rpm for 10 sec and then at 2000 rpm for 20 sec. As a result, the thickness of the layer reached about 1 μm. The coating was prebaked at 80° C. for 30 min. Thereafter, the assembly, together with an exposure mask, was set in an alignment exposure system, and the luminescent layer at its parts to be removed except for the first luminescent part was exposed to ultraviolet light. After development with a resist development liquid (NMD-3, manufactured by Tokyo Ohka Kogyo Co., Ltd.) for 20 sec, the assembly was washed with water to remove the photoresist layer in its exposed parts. Post-baking was carried out at 120° C. for 30 min. Thereafter, the buffer layer and the luminescent layer at their parts where the photoresist layer had been removed was removed by reactive ion etching with oxygen plasma. Thus, a base comprising a first pattern part where the first photoresist layer was provided on the first luminescent part was obtained.

(Formation of Second Buffer Layer)

For second luminescent layer formation, the solution for second buffer layer formation which was the same solution as used for first buffer layer formation was provided. In the same manner as described above, this solution was coated on the base including the region of the first pattern part, and the coating was heated and dried to allow hydrolysis and polycondensation to proceed and thus to perform curing. Thus, a 200 angstrom-thick transparent photocatalyst-containing layer was formed in which a photocatalyst was firmly fixed in organosiloxane. In the above case, an identical solution for buffer layer formation was used for the first buffer layer and the second buffer layer. Since, in forming the second buffer layer, the first buffer layer was in an already cured state, the first buffer layer was not eluted in the solution for second buffer layer formation.

(Formation of Second Luminescent Layer)

For second luminescent layer formation, one ml of a coating liquid as a green light emitting organic material (comprising 70 parts by mass of polyvinylcarbazole, 30 parts by mass of oxadiazole, 1 part by mass of coumalin 6, and 4900 parts by mass of monochlorobenzene) was placed dropwise on the second buffer layer in its part corresponding to the center part of the substrate to perform spin coating. Layer formation was carried out by holding at 2000 rpm for 10 sec. As a result, the thickness of the layer thus formed was 800 angstroms.

A positive-working photoresist liquid (OFPR-800, manufactured by Tokyo Ohka Kogyo Co., Ltd.) (2 ml) was placed dropwise at the center part of the base to perform spin coating. Layer formation was carried out by holding at 500 rpm for 10 sec and then at 2000 rpm for 20 sec. As a result, the thickness of the layer reached about 1 μm. The coating was prebaked at 80° C. for 30 min. Thereafter, the assembly, together with an exposure mask, was set in an alignment exposure system, and the luminescent layer at its parts to be removed except for the first luminescent part and the second luminescent part was exposed to ultraviolet light. After development with a resist development liquid (NMD-3, manufactured by Tokyo Ohka Kogyo Co., Ltd.) for 20 sec, the assembly was washed with water to remove the photoresist in its exposed parts. Post-baking was carried out at 120° C. for 30 min. Thereafter, the buffer layer and the luminescent layer at their parts where the photoresist layer had been removed were removed by reactive ion etching with oxygen plasma. Thus, a base comprising the first pattern part and the second pattern part where the second photoresist layer was provided on the second luminescent part was obtained.

(Formation of Third Buffer Layer)

The same solution for buffer layer formation as the solution for first buffer layer formation was provided. In the same manner as described above, this solution was coated on the base including the region of the first and second pattern parts, and the coating was heated and dried to allow hydrolysis and polycondensation to proceed and thus to perform curing. Thus, a 200 angstrom-thick transparent photocatalyst-containing layer was formed in which a photocatalyst was firmly fixed in organosiloxane. In the above case, an identical solution for buffer layer formation was used for the first, second and third buffer layers. Since, in forming the third buffer layer, the first and second buffer layers were already in a cured state, upon coating of the solution for third buffer layer formation, the first and second buffer layers were not eluted in the solution for third buffer layer formation.

(Formation of Third Luminescent Layer)

For third luminescent layer formation, one ml of a coating liquid as a blue light emitting organic material (70 parts by mass of polyvinylcarbazole, 30 parts by mass of oxadiazole, one part by mass of perylene, and 4900 parts by mass of monochlorobenzene) was placed dropwise on the buffer layer in its part corresponding to the center part of the substrate to perform spin coating. Layer formation was carried out by holding at 2000 rpm for 10 sec. As a result, the thickness of the layer thus formed was 800 angstroms.

A positive-working photoresist liquid (OFPR-800, manufactured by Tokyo Ohka Kogyo Co., Ltd.) (2 ml) was placed dropwise at the center part of the base to perform spin coating. Layer formation was carried out by holding at 500 rpm for 10 sec and then at 2000 rpm for 20 sec. As a result, the thickness of the layer reached about 1 μm. The coating was prebaked at 80° C. for 30 min. Thereafter, the assembly, together with an exposure mask, was set in an alignment exposure system, and the luminescent layer at its parts to be removed except for the first, second and third luminescent parts was exposed to ultraviolet light. After development with a resist development liquid (NMD-3, manufactured by Tokyo Ohka Kogyo Co., Ltd.) for 20 sec, the assembly was washed with water to remove the photoresist in its exposed parts. Post-baking was carried out at 120° C. for 30 min. Thereafter, the buffer layer and the luminescent layer at their parts where the photoresist layer had been removed was removed by reactive ion etching with oxygen plasma. Thus, a base comprising the first, second, and third luminescence parts protected by the photoresist was obtained. Thereafter, the photoresist was fully removed by acetone to expose a patterned luminescent layer.

After drying at 100° C. for one hr, a 500 angstrom-thick second electrode layer of Ca was vapor deposited onto the base, and a 2500 angstrom-thick protective layer of Ag was vapor deposited to prepare an EL element.

Example 2

(Formation of Buffer Layer)

Solid matter was separated from a dispersion of poly(styrenesulfonate)/poly(2,3-dihydrothieno[3,4-b]-1,4-dioxin (manufactured by Sigma-Aldrich Co.) in water by a supercentrifuge (Optima XL -100 K, manufactured by Beckman Coulter, Inc.) under conditions of 90,000 rpm×5 hr (20° C.), followed by filtration through a filter, predrying (150° C.×1 hr), grinding, and post-drying (under reduced pressure, 150° C.×12 hr) to give powder. A mixture of 100 parts by mass of the powder with 38 parts by mass of phosphorus pentaoxide was boiled under reflux at 170° C. for 10 hr and was distilled, followed by development in tetrahydrofuran. Insolubles were removed by filtration, 48 parts by mass of ethanol and 30 parts by mass of pyridine were added to the filtrate, and the mixture was stirred under reflux for 24 hr for esterification. After the completion of the esterification, the reaction mixture was filtered to remove insolubles, the solvent was removed from the filtrate by distillation to give 63 parts by mass of a powdery esterification product. The esterification product was dissolved in dichloroethane to a concentration of 10% by mass. The solution was filtered through a 0.5-µm filter to prepare a coating liquid.

(Formation of First Buffer Layer)

A patterned ITO substrate having a size of 6 in. square and a thickness 1.1 mm was cleaned and was used as a base and a first electrode layer. The solution for buffer layer formation prepared above was spin coated onto this substrate, and the coating was heated and dried at 150° C. for one hr. Thus, an 800 angstrom-thick transparent film was formed.

(Formation of First Luminescent Layer)

For first luminescent layer formation, one ml of a coating liquid as a red light emitting organic material (70 parts by mass of polyvinylcarbazole, 30 parts by mass of oxadiazole, 1 part by mass of a dicyanomethylenepyran derivative, and 4900 parts by mass of monochlorobenzene) was placed dropwise on the buffer layer in its part corresponding to the center part of the substrate to perform spin coating. Layer formation was carried out by holding at 2000 rpm for 10 sec. As a result, the thickness of the layer thus formed was 800 angstroms.

A positive-working photoresist liquid (OFPR-800, manufactured by Tokyo Ohka Kogyo Co., Ltd.) (2 ml) was placed dropwise at the center part of the base to perform spin coating. Layer formation was carried out by holding at 500 rpm for 10 sec and then at 2000 rpm for 20 sec. As a result, the thickness of the layer reached about 1 µm. The coating was prebaked at 80° C. for 30 min. Thereafter, the assembly, together with an exposure mask, was set in an alignment exposure system, and the luminescent layer at its parts to be removed except for the first luminescent part was exposed to ultraviolet light. After development with a resist development liquid (NMD-3, manufactured by Tokyo Ohka Kogyo Co., Ltd.) for 20 sec, the assembly was washed with water to remove the photoresist layer in its exposed parts. Post-baking was carried out at 120° C. for 30 min. Thereafter, the buffer layer and the luminescent layer at their parts where the photoresist layer had been removed was removed by reactive ion etching with oxygen plasma. Thus, a base comprising a first pattern part where the first photoresist layer was provided on the first luminescent part was obtained.

(Formation of Second Buffer Layer)

The same solution for buffer layer formation as the solution for first buffer layer formation was provided. In the same manner as described above, this solution was coated on the base including the region of the first pattern part, and the coating was heated and dried to form an 800 angstrom-thick transparent film. In the above case, an identical solution for buffer layer formation was used for the first buffer layer and the second buffer layer. Since the first buffer layer was in such a state that the solubility had been changed, even when the solution for second buffer layer formation was coated, the first buffer layer was not eluted in the solution for second buffer layer formation.

(Formation of Second Luminescent Layer)

For second luminescent layer formation, one ml of a coating liquid as a green light emitting organic material (comprising 70 parts by mass of polyvinylcarbazole, 30 parts by mass of oxadiazole, 1 part by mass of coumalin 6, and 4900 parts by mass of monochlorobenzene) was placed dropwise on the second buffer layer in its part corresponding to the center part of the substrate to perform spin coating. Layer formation was carried out by holding at 2000 rpm for 10 sect. As a result, the thickness of the layer thus formed was 800 angstroms.

A positive-working photoresist liquid (OFPR-800, manufactured by Tokyo Ohka Kogyo Co., Ltd.) (2 ml) was placed dropwise at the center part of the base to perform spin coating. Layer formation was carried out by holding at 500 rpm for 10 sec and then at 2000 rpm for 20 sec. As a result, the thickness of the layer reached about 1 µm. The coating was prebaked at 80° C. for 30 min. Thereafter, the assembly, together with an exposure mask, was set in an alignment exposure system, and the luminescent layer at its parts to be removed except for the first luminescent part and the second luminescent part was exposed to ultraviolet light. After development with a resist development liquid (NMD-3, manufactured by Tokyo Ohka Kogyo Co., Ltd.) for 20 sec, the assembly was washed with water to remove the photoresist layer in its exposed parts. Post-baking was carried out at 120° C. for 30 min. Thereafter, the buffer layer and the luminescent layer at their parts where the photoresist layer had been removed was removed by reactive ion etching with oxygen plasma. Thus, a base comprising the first pattern part and the second pattern part provided with the second photoresist layer was obtained.

(Formation of Third Buffer Layer)

The same solution for buffer layer formation as the solution for first buffer layer formation was provided. In the same manner as described above, this solution was coated on the base including the region of the first and second pattern parts, and the coating was heated and dried to form an 800 angstrom-thick transparent film. In the above case, an identical solution for buffer layer formation was used for the first, second and third buffer layers. Since, in forming the third buffer layer, the first and second buffer layers were in such a state that the solubility had been changed, upon coating of the solution for third buffer layer formation, the first and second buffer layers were not eluted in the solution for third buffer layer formation.

(Formation of Third Luminescent Layer)

For third luminescent layer formation, one ml of a coating liquid as a blue light emitting organic material (70 parts by mass of polyvinylcarbazole, 30 parts by mass of oxadiazole, one part by mass of perylene, and 4900 parts by mass of monochlorobenzene) was placed dropwise on the buffer layer in its part corresponding to the center part of the substrate to perform spin coating. Layer formation was carried out by holding at 2000 rpm for 10 sec. As a result, the thickness of the layer thus formed was 800 angstroms.

A positive-working photoresist liquid (OFPR-800, manufactured by Tokyo Ohka Kogyo Co., Ltd.) (2 ml) was placed dropwise at the center part of the base to perform spin coating. Layer formation was carried out by holding at 500 rpm for 10 sec and then at 2000 rpm for 20 sec. As a result, the thickness of the layer reached about 1 μm. The coating was prebaked at 80° C. for 30 min. Thereafter, the assembly, together with an exposure mask, was set in an alignment exposure system, and the luminescent layer at its parts to be removed except for the first, second and third luminescent parts was exposed to ultraviolet light. After development with a resist development liquid (NMD-3, manufactured by Tokyo Ohka Kogyo Co., Ltd.) for 20 sec, the assembly was washed with water to remove the photoresist layer in its exposed parts. Post-baking was carried out at 120° C. for 30 min. Thereafter, the buffer layer and the luminescent layer at their parts where the photoresist layer had been removed was removed by reactive ion etching with oxygen plasma. Thus, a base comprising the first, second, and third luminescence parts protected by the photoresist was obtained. Thereafter, the photoresist was fully removed by acetone to expose a patterned luminescent layer.

After drying at 100° C. for one hr, a 500 angstrom-thick second electrode layer of Ca was vapor deposited onto the base, and a 2500 angstrom-thick protective layer of Ag was vapor deposited to prepare an EL element.

(Evaluation of Luminescence Characteristics of EL Element)

The ITO electrode side was connected to a positive electrode, and the Ag electrode side was connected to a negative electrode, and a direct current was applied through a source meter. In Examples 1 and 2, luminescence was observed from each of the first, second, and third luminescent parts upon the application of 10 V.

(Results of Evaluation)

In Examples 1 and 2, without the formation of a secondary photoersist layer (protective layer) for covering the end part a of the patterned part, the elution of the end part of the patterned part in the coating liquid coated later to cause luminscence failure as a result of cross contamination and a change in layer thickness can be prevented, and, thus, an element with a plurality of types of high-definition patterns formed therein could be formed in a relatively easy and inexpensive manner.

Example 3

(Preparation of Solution for Buffer Layer Formation)

γ-Glycidoxypropyltrimethoxysilane having a glycido group (—CHOCH$_2$) as a functional group (TSL 8350, manufactured by Toshiba Silicone Co., Ltd.) was added to an aqueous solution of PEDOT/PPS (Baytron P, manufactured by Bayer) represented by the above formula in proportions on a PEDOT/PPS solid basis as shown in Table 1 below to prepare a solution for buffer layer formation.

(Water Resistance Test)

The solution for buffer layer formation thus obtained was spin coated onto a glass substrate to form a 1000 angstrom-thick coating on a dry basis, and the coating was heat treated on a hot plate under conditions of 100° C.×10 min for crosslinking curing. Subsequently, the glass substrate with the coating formed thereon was immersed in 100 g of water to visually evaluate the state of coating.

(Measurement of Luminescence Efficiency)

Indium tin oxide (ITO) was vapor deposited onto a transparent glass substrate to form a first electrode. Subsequently, the solution for buffer layer formation prepared above was spin coated onto the first electrode to form a 1000 angstrom-thick layer on a dry basis onto the whole area of the first electrode, and the coating was heat treated on a hot plate under conditions of 100° C.×10 min to perform crosslinking curing, whereby a first buffer layer was formed.

Next, a 1 wt % xylene solution of a poly-p-phenylenevinylene derivative (hereinafter abbreviated to "MEH-PPV") represented by formula

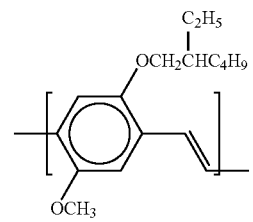

was prepared as a solution for luminescent layer formation. The solution for luminescent layer formation was spin coated onto the whole area of the first buffer layer to form a first luminescent layer having a thickness of 1000 angstrom on a dry basis. Thus, a first EL layer comprising a first hole injection layer and a first luminescent layer was formed.

A second electrode was formed on the first EL layer by vapor depositing calcium to a layer thickness of 1000 angstrom.

In the EL element thus obtained, the first electrode was connected as a positive electrode to a source meter, and the second electrode was connected as a negative electrode to the source meter, followed by the application of a direct current.

The current value as a function of the applied voltage was measured with a source meter, and the brightness of the organic EL element as a function of the applied voltage was measured with a luminance meter. Here the brightness per unit area as a function of the applied voltage was calculated as luminescence efficiency.

Further, the maximum luminescene efficiency of the EL element was calculated by presuming the maximum luminescence efficiency, when only PEDOT/PPS was used as a material for buffer layer formation, to be 1.

The results were as summarized in Table 1.

Example 4

An EL element was prepared in the same manner as in Example 3, except that, in the solution for buffer layer formation, 3-acryloxypropyltrimethoxysilane containing an acryloyl group (—CH=CH$_2$) as a functional group (KBM 5103, manufactured by Shin-Etsu Silicone) was added in proportions on a PEDOT/PPS solid basis as indicated in Table 1.

Comparative Example 1

An EL element was prepared in the same manner as in Example 3, except that, in the solution for buffer layer formation, only PEDOT/PPS was used.

Comparative Example 2

An EL element was prepared in the same manner as in Example 3, except that, in the solution for buffer layer formation, γ-methacryloxypropyltrimethoxysilane containing a methacryloxy group (—CCH$_3$=CH$_2$) as a functional group (TSL 8370, manufactured by Toshiba Silicone Co., Ltd.) was added in proportions on a PEDOT/PPS solid basis as indicated in Table 1.

Comparative Example 3

An EL element was prepared in the same manner as in Example 3, except that, in the solution for buffer layer formation, N-(β-aminoethyl)-γ-aminopropyltrimethoxysilane containing an amino group (—$NH_2$) as a functional group (TSL 8340, manufactured by Toshiba Silicone Co., Ltd.) was added in proportions on a PEDOT/PPS solid basis as indicated in Table 1.

Comparative Example 4

An EL element was prepared in the same manner as in Example 3, except that, in the solution for buffer layer formation, γ-mercaptopropyltrimethoxysilane (KBM 803, manufactured by The Shin-Etsu Chemical Co., Ltd.) containing a mercapto group (—SH) as a functional group was added in proportions on a PEDOT/PPS solid basis as indicated in Table 1.

The EL elements of Example 4 and Comparative Examples 1 to 4 were also evaluated in the same manner as in Example 3. The results were as summarized in Table 1 below.

TABLE 1

| | Coupling agent | | | | Maximum |
| --- | --- | --- | --- | --- | --- |
| | Functional group | Addition amount, wt % | Solubility | Patternability | luminescent efficiency |
| Ex. 3 | Glycido group | 0.1 | x | x | 1.00 |
| | | 1 | o | o | 1.10 |
| | | 5 | o | o | 1.2 |
| | | 10 | o | o | 1.0 |
| | | 50 | o | o | 1.0 |
| | | 100 | o | o | 0.5 |
| Ex. 4 | Acryloyl group | 0.1 | x | x | 1.0 |
| | | 1 | o | o | 1.05 |
| | | 5 | o | o | 1.1 |
| | | 10 | o | o | 1.0 |
| | | 50 | o | o | 1.0 |
| | | 100 | o | o | 0.6 |
| Comp. Ex. 1 | Not added | 0 | x | x | 1.0 |
| Comp. Ex. 2 | γ-methacryloxy group | 0.1 | x | x | 1.0 |
| | | 1 | x | x | 1.0 |
| | | 5 | x | x | 1.0 |
| | | 10 | x | x | 1.0 |
| | | 50 | x | x | 0.5 |
| | | 100 | x | x | 0.3 |
| Comp. Ex. 3 | Amino group | 0.1 | x | x | 1.0 |
| | | 1 | x | x | 1.0 |
| | | 5 | x | x | 1.0 |
| | | 10 | x | x | 1.0 |
| | | 50 | x | x | 0.6 |
| | | 100 | x | x | 0.5 |
| Comp. Ex. 4 | Mercapto group | 0.1 | x | x | 1.0 |
| | | 1 | x | x | 1.0 |
| | | 5 | x | x | 1.0 |
| | | 10 | x | x | 1.0 |
| | | 50 | x | x | 0.4 |
| | | 100 | x | x | 0.3 |

Pattening of EL Layer

A first electrode was formed by vapor depositing indium tin oxide (ITO) on a transparent glass substrate. Subsequently, the solution for buffer layer formation of each of Examples 1 and 2 and Comparative Examples 1 to 3 was spin coated onto the whole area of the first electrode to form a coating having a thickness of 800 angstroms on a dry basis, and the coating was heat treated on a hot plate under conditions of 100° C.×10 min to perform crosslinking curing treatment, whereby a first buffer layer was formed.

The solution for luminescent layer formation used in Example 3 was spin coated onto the whole area of the first buffer to form a first luminescent layer having a thickness of 1000 angstroms on a dry basis. Thus, a first EL layer comprising a first hole injection layer and a first luminescent layer was formed.

Next, a positive-working photoresist (OFPR-800, manufactured by Tokyo Ohka Kogyo Co., Ltd.) was spin coated onto the whole area of the first luminescent layer to form a coating having a thickness of 1 μm on a dry basis, and the coating was dried to form a first photoresist layer.

Subsequently, ultraviolet light was applied by an alignment exposure system through a photomask (line width (light shielding part) 85 μm, space width (light transmission part) 215 μm) in which the light shielding part corresponded to the first luminescent layer, and the photoresist in the exposed area was removed by a resist developing liquid (NMD-3, manufactured by Tokyo Ohka Kogyo Co., Ltd.).

Thereafter, dry etching was carried out with an atmospheric-pressure plasma device to remove the first EL layer part from which the photoresist had been removed, whereby the first EL layer was patterned.

Subsequently, a second buffer layer, a second luminescent layer, and a second photoresist layer were formed on the dry-etched organic EL element without separating the remaining photoresist in the same manner as in the formation of the first EL layer.

Next, the same photomask as used above was disposed at a position which had been shifted by one pitch (100 μm) relative to the substrate, followed by exposure and development in the same manner as described above to remove the photoresist. The second EL layer part from which the photoresist had been removed was then removed to pattern the second EL layer.

Subsequently, a third buffer layer, a third luminescent layer, and a third photoresist layer were formed on the dry-etched EL element without separating the remaining photoresist in the same manner as in the formation of the first EL layer.

Next, the same photomask as used above was disposed at a position which had been shifted by two pitches (200 μm) relative to the substrate, followed by exposure and development in the same manner as described above to remove the photoresist. The third EL layer part from which the photoresist had been removed was then removed to pattern the third EL layer.

The substrate on which the EL layers had been formed was observed under a microscope, and, as a result, it was found that, in the pattern, the line width and the space width were 85 μm and 15 μm, respectively.

The photoresist in the unexposed area remaining on the EL layer was immersed in a resist solvent for 10 min to fully remove only the resist part, whereby a substrate provided with a patterned EL layer was provided.

For examining patterning, the level of the patternability of the line pattern part was observed under a fluorescence optical microscope. The results were as summarized in Table 1.

Formation of Intermediate Layer

Example 5

A buffer layer was formed in the same manner as in Example 3, except that, in the coating liquid for hole injection layer formation used in Example 3, the content of γ-glycidoxypropyltrimethoxysilane containing a glycido group (—CHOCH$_2$) as a functional group (TSL 8350, manufactured by Toshiba Silicone Co., Ltd.) was 5% by weight.

Subsequently, the substrate with a buffer layer formed thereon was immersed in an aqueous tetramethoxysilane (KBM-04, manufactured by The Shin-Etsu Chemical Co., Ltd.) solution for 5 min, and the substrate was then washed with ion exchanged water. This substrate was dried on a hot plate under conditions of 110° C.×30 min to form an intermediate layer (an electron blocking layer).

After the formation of the intermediate layer, the buffer layer was inspected by microscopic observation and layer thickness measurement. As a result, no change in layer thickness was observed.

Next, the same solution for luminescent layer formation as used in Example 3 was provided, and, in the same manner as in Example 3, a luminescent layer was formed on the intermediate layer to form an EL layer comprising a hole injection layer, an intermediate layer, and a luminescent layer on the substrate.

Comparative Example 5

The same solution for buffer layer formation as in Comparative Example 1 was provided, and the procedure of Comparative Example 1 was repeated to form a buffer layer. Subsequently, the substrate with a buffer layer formed thereon was immersed in an aqueous tetramethoxysilane (KBM-04, manufactured by The Shin-Etsu Chemical Co., Ltd.) solution for 5 min, and, thereafter, the substrate was washed with ion exchanged water. This substrate was dried on a hot plate under conditions of 130° C.×30 min to form an intermediate layer (electron blocking layer).

After the formation of the intermediate layer, the buffer layer was observed by microscopic observation and layer thickness measurement. As a result, it was found that the buffer layer disadvantageously disappeared.

Next, the same solution for luminescent layer formation as used in Example 3 was provided, and the procedure of Example 3 was repeated to form a luminescent layer on the intermediate layer.

A second electrode was formed on each EL layer formed in Example 5 and Comparative Example 5 by vapor depositing calcium to a layer thickness of 1000 angstroms. Further, silver was vapor deposited to a thickness of 2000 angstroms as an oxide protective film onto the second electrode to prepare an EL element.

In the EL element thus prepared, the first electrode was connected as a positive electrode to a source meter, and the second electrode was connected as a negative electrode to the source meter, and a direct current was applied.

The current value as a function of the applied voltage was measured with a source meter, and the brightness of the organic EL element as a function of the applied voltage was measured with a luminance meter. Here the brightness per unit area as a function of the applied voltage was calculated as luminescence efficiency.

Further, the maximum luminescence efficiency of the EL element was calculated by presuming the maximum luminescence efficiency, when only PEDOT/PPS was used as a material for buffer layer formation, to be 1.

The results were as summarized in Table 2. The organic EL element in Example 6 is shown in comparison with the organic EL element in Example 3 which has the same layer construction as the organic EL element in Example 6 except that no intermediate layer was provided (the amount of γ-glycidoxypropyltrimethoxysilane added being 5% by weight). The EL element in Comparative Example 5 is shown in comparison with the EL element in Comparative Example 1 which has the same layer construction as the EL element in Comparative Example 5, except that no intermediate layer was provided.

TABLE 2

| | Coupling agent | Intermediate layer | Maximum luminescence efficiency |
|---|---|---|---|
| Ex. 3 | Glycido group | Not provided | 1.2 |
| Ex. 6 | Glycido group | Provided | 1.5 |
| Comp. Ex. 1 | Not used | Not provided | 1.0 |
| Comp. Ex. 5 | Not used | Provided | 0.3 |

The invention claimed is:

1. A process for producing an electroluminescent element, comprising repeating, at least twice, a step of forming a patterned electroluminescent layer part comprising a buffer layer and a luminescent layer by patterning using a photolithographic process, thereby producing an electroluminescent element comprising a patterned electroluminescent layer, said process comprising the steps of:
    forming a first patterned electroluminescent layer part comprising a first buffer layer as the lowermost layer and a first luminescent layer; and
    forming a second patterned electroluminescent layer part by coating a solution for forming a second buffer layer in a region including said first patterned electroluminescent layer part and forming a second luminescent layer thereon;
    wherein said first buffer layer is immiscible with said solution for forming said second buffer layer.

2. The process according to claim 1, wherein said first buffer layer after undergoing curing treatment is immiscible with said solution for second buffer layer formation.

3. The process according to claim 2, wherein the step of curing said first buffer layer is carried out by heat or radiation energy.

4. The process according to claim 3, wherein said first buffer layer is formed from a coating liquid for buffer layer formation, comprising at least a metal oxide and a heat- and/or photo-curable binder.

5. The process according to claim 3, wherein said first buffer layer is formed from a coating liquid for buffer layer formation, comprising at least a photocatalyst and a heat- and/or photo-curable binder.

6. The process according to claim 4, wherein said binder comprises an organopolysiloxane.

7. The process according to claim 5, wherein said photocatalyst is titanium dioxide.

8. The process according to claim 6, wherein said organopolysiloxane is a hydrolyzed condensate or cohydrolyzed condensate of one or two or more silicon compounds represented by formula $Y_nSiX_{(4-n)}$ wherein Y represents an alkyl, fluoroalkyl, vinyl, amino, phenyl, or epoxy group; X represents an alkoxyl group or a halogen; and n is an integer of 0 to 3.

9. The process according to claim 3, wherein said first buffer layer is formed from a water soluble coating liquid for buffer layer formation, and said first luminescent layer is formed from a nonaqueous coating liquid for luminescent layer formation.

10. The process according to claim 9, wherein said water soluble coating liquid for buffer layer formation contains an organic material that contains a hydrophilic group in its molecule and is dissolvable or dispersible in water or an alcohol.

11. The process according to claim 10, wherein said hydrophilic group is selected from the group consisting of sulfonic acid, carboxyl, and hydroxyl groups.

12. The process according to claim 11, wherein said organic material comprises polystyrenesulfonic acid or a polystyrenesulfonic acid derivative.

13. The process according to claim 11, wherein said organic material comprises polythiophenesulfonic acid or a polythiophenesulfonic acid derivative.

14. The process according to claim 11, wherein said organic material is a salt of a poly-3,4-alkenedioxythiophene with polystyrenesulfonic acid, or a derivative thereof.

15. The process according to claim 10, wherein said water soluble coating liquid for buffer layer formation further comprises a silane coupling agent.

16. The process according to claim 15, wherein said silane coupling agent is represented by formula

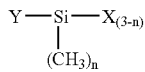

wherein X represents OR wherein R represents an alkyl group; Y represents an epoxy or acryloyl group; and n is an integer of 0 to 2.

17. The process according to claim 15, wherein the content of the silane coupling agent in said water soluble coating liquid for buffer layer formation is not less than 0.5% by weight.

18. The process according to claim 1, wherein said first buffer layer has been rendered immiscible with said solution for second buffer layer formation by varying the solubility of said first buffer layer.

19. The process according to claim 18, wherein the step of varying the solubility is carried out by using heat or radiation energy.

20. The process according to claim 18, wherein said first buffer layer is formed from an organic material-containing coating liquid for buffer layer formation, and said organic material is such that a part or all of hydrophilic groups in a hydrophilic organic material are converted to oleophilic groups and a part or all of said oleophilic groups are returned to hydrophilic groups by using heat or radiation energy.

21. The process according to claim 20, wherein said hydrophilic group is selected from the group consisting of sulfonic acid, carboxyl, and hydroxyl groups.

22. The process according to claim 21, wherein said organic material comprises polystyrenesulfonic acid or a polystyrenesulfonic acid derivative.

23. The process according to claim 21, wherein said organic material comprises polythiophenesulfonic acid or a polythiophenesulfonic acid derivative.

24. The process according to claim 20, wherein said organic material is a salt of a poly-3,4-alkenedioxythiophene with polystyrenesulfonic acid, or a derivative thereof.

25. The process according to claim 21, wherein the conversion of hydrophilic groups to oleophilic groups is carried out by a protection reaction.

26. The process according to claim 25, wherein said protection reaction is at least one reaction selected from the group consisting of esterification, acetylation, tosylation, triphenylmethylation, alkylsilylation, and alkylcarbonylation.

27. The process according to claim 1, wherein an electron blocking layer is provided between said buffer layer and said luminescent layer and said electron blocking layer is formed of a material that is dissolvable or dispersible in water or an alcohol.

* * * * *